US011371675B2

(12) United States Patent
Okuno et al.

(10) Patent No.: US 11,371,675 B2
(45) Date of Patent: Jun. 28, 2022

(54) LIGHT EMITTING DEVICE

(71) Applicant: Panasonic Intellectual Property Management Co., Ltd., Osaka (JP)

(72) Inventors: Tatsuya Okuno, Osaka (JP); Takeshi Abe, Osaka (JP); Shozo Oshio, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 17/047,220

(22) PCT Filed: Apr. 10, 2019

(86) PCT No.: PCT/JP2019/015550
§ 371 (c)(1),
(2) Date: Oct. 13, 2020

(87) PCT Pub. No.: WO2019/203079
PCT Pub. Date: Oct. 24, 2019

(65) Prior Publication Data
US 2021/0048168 A1    Feb. 18, 2021

(30) Foreign Application Priority Data

Apr. 19, 2018 (JP) .............................. JP2018-080467
Nov. 6, 2018 (JP) .............................. JP2018-209007

(51) Int. Cl.
*F21V 7/26* (2018.01)
*F21V 15/01* (2006.01)
*H01S 5/022* (2021.01)

(52) U.S. Cl.
CPC ................ *F21V 7/26* (2018.02); *F21V 15/01* (2013.01); *H01S 5/022* (2013.01)

(58) Field of Classification Search
CPC ... F21V 7/26; F21V 15/01; F21V 9/20; F21V 9/30; F21V 7/05; H01S 5/022;
(Continued)

(56) References Cited

U.S. PATENT DOCUMENTS 7,040,774 B2 * 5/2006 Beeson .............. G02B 19/0019
362/257
7,497,581 B2 * 3/2009 Beeson ................ G02B 27/286
362/257
7,891,844 B2 * 2/2011 Schug ................. H01L 25/0753
362/293
(Continued)

FOREIGN PATENT DOCUMENTS

CN          101997265 A      3/2011
CN          102466188 A      5/2012
(Continued)

OTHER PUBLICATIONS

Extended European Search Report for corresponding EP Application No. 19788601.3, dated Mar. 25, 2021.
(Continued)

*Primary Examiner* — Tsion Tumebo
(74) *Attorney, Agent, or Firm* — Renner, Otto, Boisselle & Sklar, LLP

(57) ABSTRACT

A light emitting device (A) includes a laser light source (1) that emits laser light (100), a housing (2A) that includes a bottom wall (3) and a side wall, and a first wavelength converter (20) provided on the side wall, the first wavelength converter (20) containing a first phosphor. The bottom wall of the housing is irradiated with the laser light emitted from the laser light source, and the first phosphor is excited by diffused light of the laser light diffused by the bottom wall. With such a configuration, the light emitting device (A) improves color uniformity and chromaticity flexibility while increasing power density of output light.

14 Claims, 10 Drawing Sheets

(58) Field of Classification Search
CPC ............. H01S 5/02251; H01S 5/32341; H01S 5/0087; F21K 9/64; F21K 9/62; F21Y 2115/30
See application file for complete search history.

(56) References Cited

U.S. PATENT DOCUMENTS

| | | | | |
|---|---|---|---|---|
| 8,096,668 B2* | 1/2012 | Abu-Ageel | ............ | G02B 5/045 362/84 |
| 8,172,415 B2* | 5/2012 | Wegh | ............ | F21S 10/02 362/84 |
| 8,851,694 B2* | 10/2014 | Harada | ............ | F21V 9/32 362/84 |
| 9,581,300 B2* | 2/2017 | Harbers | ............ | F21V 13/04 |
| 10,760,745 B2* | 9/2020 | Einig | ............ | F21V 7/24 |
| 2010/0254115 A1* | 10/2010 | Wegh | ............ | G02B 6/0011 362/84 |
| 2011/0044070 A1 | 2/2011 | Takahashi | | |
| 2012/0106185 A1 | 5/2012 | Kishimoto et al. | | |
| 2013/0335989 A1 | 12/2013 | Sato | | |

FOREIGN PATENT DOCUMENTS

| | | |
|---|---|---|
| JP | 5090549 B2 | 9/2012 |
| JP | 2014-179231 A | 9/2014 |
| JP | 2017-083907 A | 5/2017 |
| WO | 2006016325 A2 | 2/2006 |
| WO | 2009013695 A2 | 1/2009 |

OTHER PUBLICATIONS

International Search Report for corresponding Application No. PCT/JP2019/015550, dated May 21, 2019.
Written Opinion for corresponding Application No. PCT/JP2019/015550, dated May 21, 2019.

* cited by examiner (a)

(b)

(a)

(b)

(a)

(b)

(a)

(b)

(a)

(b)

(a)

(b)

LIGHT EMITTING DEVICE

TECHNICAL FIELD

The present invention relates to a light emitting device.

BACKGROUND ART

A light emitting device that utilizes photoluminescence of a phosphor using laser light as excitation light and obtains white light from mixture of a part of the laser light and fluorescence emitted from the phosphor has been known.

To improve light output of the light emitting device, it is awaited to irradiate the phosphor with excitation light having a high power density. It is however known that the saturation of fluorescent output of the phosphor occurs with the increase in the power of the excitation light, and thus the conversion efficiency from laser light to white light may decrease. Moreover, fluorescence has orientation distribution with isotropic diffusion (non-directivity), while laser light has high straightness (directivity). Due to such properties of fluorescence and laser light, color irregularity may occur in the irradiation spot of the output light, and color uniformity may be lowered.

Patent Literature 1 discloses a light emitting device including an excitation light source for emitting laser light, and a sintered light emitter that is obtained by sintering a ceramic material and a phosphor glowing by excitation light emitted from the excitation light source by using a binder and has grain boundaries therein. By scattering the laser light at the grain boundaries inside the phosphor, the orientation distribution of the laser light is converted isotropically, and color uniformity of the white light can be improved.

CITATION LIST

Patent Literature

Patent Literature 1: Japanese Patent No. 5090549

SUMMARY OF INVENTION

However, in the light emitting device in Patent Literature 1, the extraction efficiency of the light from the emitting part sometimes decreases as the light scattering inside the phosphor becomes excessive. Moreover, as the light extraction efficiency decreases, the light absorption ratio of the phosphor also decreases. Accordingly, when the excitation light is a blue light having a wavelength of 440 to 490 nm, for example, it is difficult for the light emitting device to obtain a color tone in a low color temperature range, resulting in little flexibility in chromaticity.

The present invention has been made in consideration of such problems as described above, which are inherent in the prior art. An object of the present invention is to provide a light emitting device that improves color uniformity and chromaticity flexibility while increasing power density of output light.

In order to solve the above-described problems, a light emitting device according to an aspect of the present invention includes: a laser light source emitting laser light; a housing including a bottom wall and a side wall; and a first wavelength converter provided on the side wall, the first wavelength converter containing a first phosphor. The bottom wall of the housing is irradiated with the laser light emitted from the laser light source, and the first phosphor is excited by diffused light of the laser light diffused by the bottom wall.

BRIEF DESCRIPTION OF DRAWINGS

FIG. 1(a) is a perspective view of the light emitting device. FIG. 1(b) is a cross-sectional view taken along line I-I in FIG. 1(a).

FIG. 2(a) is a perspective view of the light emitting device. FIG. 2(h) is a cross-sectional view taken along line II-II in FIG. 2(a).

FIG. 4(a) is a perspective view of the light emitting device. FIG. 4(b) is a cross-sectional view taken along line IV-IV in FIG. 4(a).

FIG. 5(a) is a perspective view of the light emitting device. FIG. 5(b) is a cross-sectional view taken along line V-V in FIG. 5(a).

FIG. 6(a) is a perspective view of the light emitting device. FIG. 6(b) is a cross-sectional view taken along line VI-VI in FIG. 6(a).

FIG. 7(a) is a perspective view of the light emitting device. FIG. 7(b) is a cross-sectional view taken along line VII-VII in FIG. 7(a).

DESCRIPTION OF EMBODIMENTS

Figure 1:
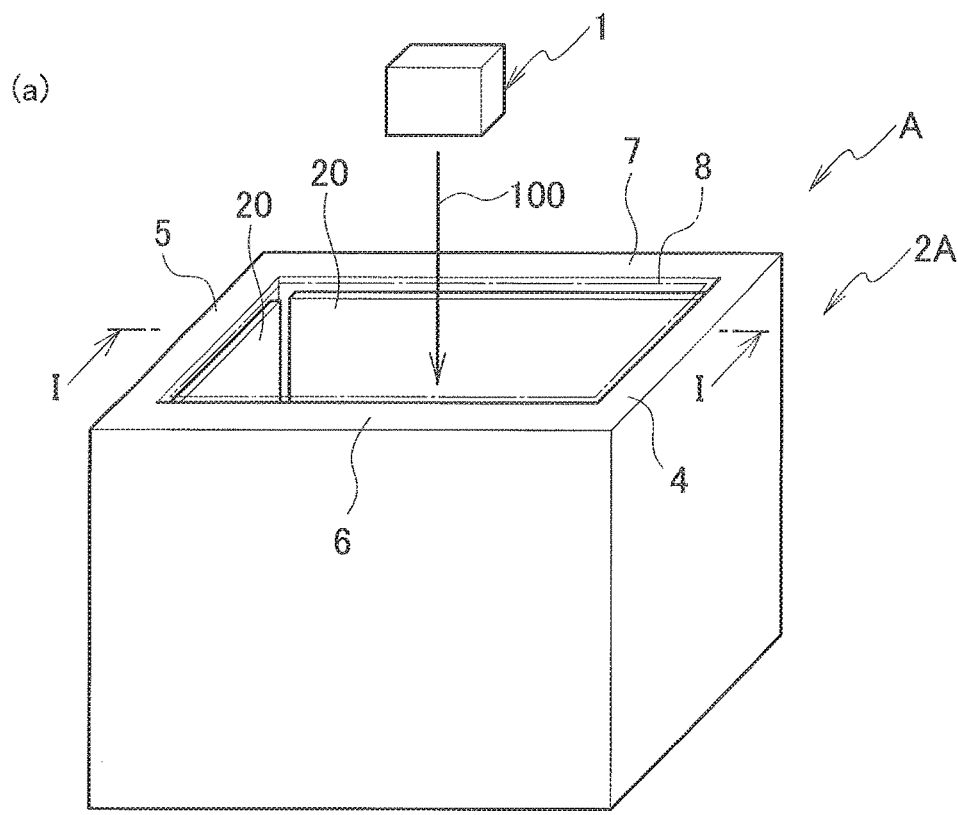
FIG. 1 is a schematic diagram illustrating an example of a light emitting device according to a first embodiment.
Figure 1:
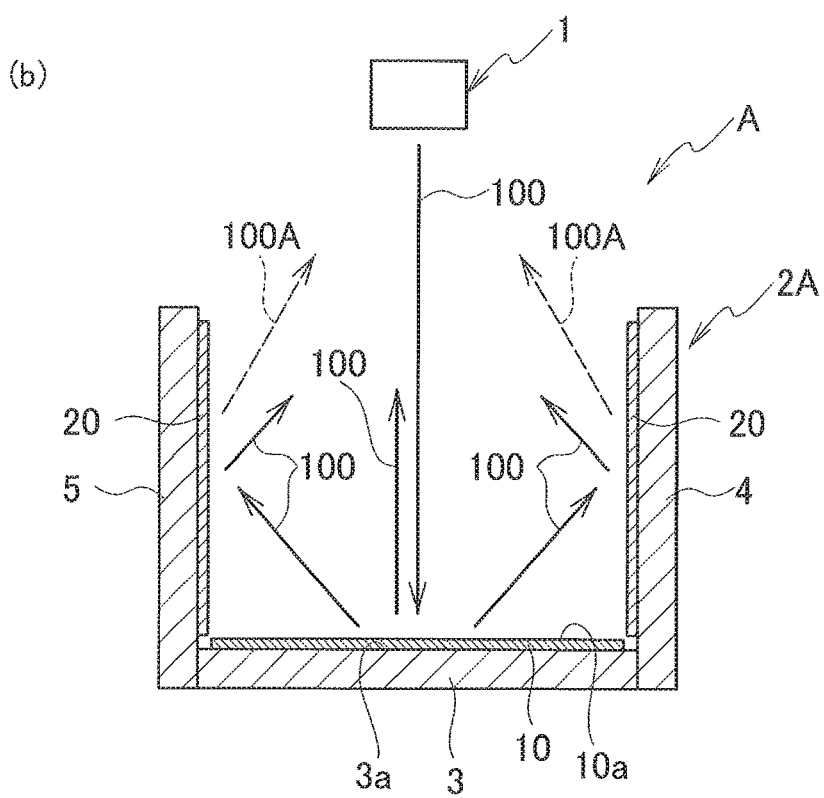

The present embodiments are described below with reference to the drawings. Each of the below described embodiments shows a preferred specific example according to the present embodiments. Accordingly, the numerical values, shapes, materials, components, arrangement positions of the components, connecting forms, and the like shown in the following embodiments are merely examples and are not intended to limit the present embodiments. Note that FIGS. 1 to 11 are schematic diagrams and are not necessarily illustrated strictly. Moreover, in FIGS. 1 to 11, substantially the same components are denoted by the same reference numerals, and redundant descriptions are omitted or simplified.

First Embodiment

As shown in FIG. 1, a light emitting device A according to the present embodiment includes a laser light source 1 that emits a laser light, and a housing 2A including a bottom wall 3 and a side wall. The housing 2A is provided with first wavelength converters 20 containing a first phosphor. The first wavelength converters 20 are provided on the side wall.

(Laser Light Source)

The laser light source 1 is a light emitting element that emits a laser light 100. The laser light source 1 is not limited, but a laser diode, such as a surface emitting laser diode, may be used. An inorganic or organic electroluminescence element may be also used as the laser light source 1.

As described later, the laser light 100 emitted from, the laser light source 1 has any wavelength to be absorbed by the first phosphor contained in the first wavelength converters. Laser light has a power density higher than that of general diffused light and has high straightness and directivity.

As the laser light 100 emitted from the laser light source 1, at least one of ultraviolet laser light emitting ultraviolet rays or visible laser light emitting visible rays may be used. The laser light 100 preferably has a maximum intensity within a wavelength range of 440 nm or more and less than 470 nm, more preferably within a wavelength range of 445 nm or more and less than 460 nm. The first phosphor is thus efficiently excited. When the laser light has a maximum intensity within the above wavelength range, the laser light becomes blue light with good visibility and is used without waste as output light of the light emitting device as well as excitation light of the phosphor. Further, when such a laser light is used, a blue semiconductor laser element, which is relatively inexpensive and has high actual results, may be used as the laser light source, so that the light emitting device is suitable for industrial production.

The specific numerical value of the light density in the laser light 100 is not limited but is preferably 3 W/mm$^2$ or more and less than 100 W/mm$^2$, for example. When the light density of the laser light 100 is 3 W/mm$^2$ or more, a difference from an LED illumination becomes clear, and thus a light emitting device obtained has high value as a differentiated product. When the light density of the laser light 100 is less than 100 W/mm$^2$, a light emitting device obtained has low heat generation due to energy loss of the wavelength converter.

Note that the maximum value of light density of the laser light 100 preferable for a general illumination is 3 W/mm$^2$ or more and less than 20 W/mm$^2$. The maximum value of light density of the laser light 100 preferable for an endoscope is 10 W/mm$^2$ or more and less than 50 W/mm$^2$. The maximum value of the light density of the laser light 100 preferable for a projector is 40 W/mm$^2$ or more and less than 100 W/mm$^2$.

(Housing)

The light emitting device A shown in FIG. 1 includes the housing 2A that holds the first wavelength converters 20 containing the first phosphor therein. Specifically, the housing 2A includes the bottom wall 3 and the side wall that includes a right wall 4, a left wall 5, a front wall 6, and a rear wall 7. The housing 2A has a substantially rectangular parallelepiped shape when viewed from the outside. The housing 2A has an internal space partitioned by the bottom wall 3, the right wall 4, the left wall 5, the front wall 6, and the rear wall 7. The housing 2A includes an aperture 8 on the upper surface. The aperture 8 communicates with the internal space, and thus the laser light 100 is emitted into the internal space through the aperture 8.

The housing 2A holds a light diffusing layer 10 containing inorganic particles on an upper surface 3a of the bottom wall 3 in the internal space thereof. The right wall 4, the left wall 5, the front wall 6, and the rear wall 7 hold the first wavelength converters 20 containing the first phosphor on their inner surfaces. As shown in FIG. 1, the light diffusing layer 10 containing inorganic particles preferably has a plate shape or a film shape and is fixed to the bottom wall 3. Each of the first wavelength converters 20 containing the first phosphor also preferably has a plate shape or a film shape and is fixed to the right wall 4, the left wall 5, the front wall 6, and the rear wall 7. Accordingly, the shapes of the light diffusing layer 10 and the first wavelength converters 20 are stabilized, and the laser light 100 is efficiently diffused for wavelength conversion.

The light emitting device A using the housing 2A has a structure called a reflection type. The reflection type light emitting device A emits output light in a direction in Which the laser light 100 is reflected by the light diffusing layer 10.

In the reflection type light emitting device A, the bottom wall 3 of the housing 2A is preferably made of a reflecting member reflecting the laser light 100, and the laser light 100 preferably enters the internal space through the aperture 8 of the housing 2A. By using the reflecting member as the bottom wall 3, as described later, the laser light 100 is reflected by the light diffusing layer 10 and/or the bottom wall 3, and the reflected light efficiently excites the first phosphor in the first wavelength converters 20.

The reflecting member is not limited as long as it reflects the laser light 100, and a member made of any solid substance may be used. As the reflecting member, a member having a metal or a metal oxide at least on its surface may be used. The metal of the reflecting member is, for example, aluminum, and the metal oxide of the reflecting member is, for example, alumina. The reflecting member made of such a material is preferable because heat generated by irradiation with the laser light 100 is efficiently exhausted.

A member making the side wall is not limited, and a member made of any solid substance may be used. As a member making the side wall, a member containing a metal or a metal oxide may be used similarly to the bottom wall 3. The side wall containing such a material is preferable because heat generated by irradiation with scattered light of the laser light 100 is efficiently exhausted.

(First Wavelength Converter)

In the present embodiment, the first wavelength converter 20 contains at least the first phosphor. As the first phosphor, a phosphor that absorbs a part of energy of light formed by diffusion of the laser light 100 and emits fluorescence having a wavelength different from that of the laser light 100 in an isotropic orientation distribution may be used. Examples of such a phosphor includes a Ce$^{3+}$ activated phosphor containing Ce$^{3+}$ as an emission center.

Examples of the Ce$^{3+}$ activated phosphor include phosphors based on a compound having a garnet crystal structure, such as an aluminate, a silicate, an aluminosilicate or the like. As such a phosphor, at least one selected from the group consisting of Lu$_3$Ga$_2$(AlO$_4$)$_3$:Ce$^{3+}$, Lu$_3$Al$_2$(AlO$_4$)$_3$:Ce$^{3+}$, Y$_3$Ga$_2$(AlO$_4$)$_3$:Ce$^{3+}$, Y$^3$Al$_2$(AlO$_4$)$_3$:Ce$^{3+}$, (Y,Gd)$_3$Al$_2$(AlO$_4$)$_3$:Ce$^{3+}$, Ca$_3$Sc$_2$(SiO$_4$)$_3$:Ce$^{3+}$, Lu$_2$CaMg$_2$(SiO$_4$)$_3$:Ce$^{3+}$, and (Lu,Ca)$_3$(Al, Mg)$_2$((Al,Si)O$_4$)$_3$:Ce$^{3+}$ may be used.

Examples of the Ce$^{3+}$ activated phosphor include phosphors based on a complex oxide containing a rare earth element or an alkaline earth metal, such as a phosphate, a silicate, or an aluminate. As such a phosphor, at least one selected from the group consisting of $LaPO_4:Ce^{3+}$, $YPO_4:Ce^{3+}$, $Y_2SiO_5:Ce^{3+}$, $Ca_2MgSi_2O_7:Ce^{3+}$, $YAlO_3:Ce^{3+}$, and $CeMgAl_{11}O_{19}$ may be used.

Examples of the $Ce^{3+}$ activated phosphor include phosphors based on a nitride or oxynitride containing a rare earth element or an alkaline earth metal. As such a phosphor, at least one selected from the group consisting of $Y_2Si_3O_3N_4:Ce^{3+}$, $La_3Si_6N_{11}:Ce^{3+}$, $CaAlSiN_3:Ce^{3+}$, and $Ca(Al,Si)_2(N,O)_3$ may be used.

As the first phosphor, a phosphor that has a relatively long afterglow and easy saturation of fluorescence output when directly irradiated with the laser light 100 may be also used. Examples of such a phosphor include phosphors containing ions that emit fluorescence by electronic energy transition of at least one of a parity forbidden type or a spin forbidden type. The light emitting device according to the present embodiment uses scattered laser light having low energy for exciting the phosphor, and thus it is possible to positively use a phosphor that could not be expected to have high fluorescence output under the excitation condition by the laser light.

Examples of the ions emitting fluorescence by electronic energy transition of at least one of the parity forbidden type or the spin forbidden type include ions emitting fluorescence by the transition between f-electron levels of a rare earth element and ions emitting fluorescence by the transition between d-electron levels of a transition metal element. Examples of such ions include trivalent rare earth ions ($Pr^{3+}$, $Eu^{3+}$, $Gd^{3+}$, $Tb^{3+}$) except $Ce^{3+}$, and monovalent to tetravalent transition metal ions having an electronic configuration of $3d^n$ ($Cr^{3+}(3d^3)$, $Mn^{2+}(3d^5)$, $Mn^{4+}(3d^3)$, $Fe^{3+}(3d^5)$).

The first phosphor preferably contains one ion selected from the group consisting of $Eu^{2+}$, $Eu^{3+}$, $Tb^{3+}$, and $Mn^{4+}$ as an emission center. Such a phosphor emits visible light suitable for illumination use, and thus a light emitting device obtained is easy to design an illumination light.

Examples of the $Eu^{2+}$ activated phosphor include phosphors based on a complex oxide of an alkaline earth metal. As such a phosphor, at least one selected from the group consisting of an alkaline earth metal silicate, such as $AE_2SiO_4:Eu^{2+}$, an alkaline earth metal aluminate, such as $AEMgAl_{10}O_{17}:Eu^{2+}$, an alkaline earth metal halophosphate, such as $AE_{10}(PO_4)_6Cl_2:Eu^{2+}$, and an alkaline earth metal phosphate, such as $AE_2P_2O_7:Eu^{2+}$, may be used, Note that AE represents at least one selected from the group consisting of Ca, Sr, and Ba.

Examples of the $Eu^{2+}$ activated phosphor include phosphors based on a complex nitride of an alkaline earth metal (AE). As such a phosphor, at least one selected from the group consisting of $AE_2Si_5N_8:Eu^{2+}$, $AEAlSi_4N_7:Eu^{2+}$, and $AEAlSiN_3:Eu^{2+}$ may be used. Examples of the $Eu^{2+}$ activated phosphor include phosphors based on a complex oxynitride of an alkaline earth metal (AE). As such a phosphor, at least one selected from the group consisting of $AESi_2O_2N_2:Eu^{2+}$ and $AE_3Si_6O_{12}N_2:Eu^{2+}$ may be used.

Examples of the $Eu^{3+}$ activated phosphor include phosphors based on an oxide or a complex oxide of a rare earth element. As such a phosphor, at least one selected from the group consisting of a rare earth oxide, such as $RE_2O_3:Eu^{3+}$, a rare earth vanadate, such as $REVO_4:Eu^{3+}$ and $RE(P,V)O_4:Eu^{3+}$, a rare earth phosphate, such as $REPO_4:Eu^{3+}$, a rare earth silicate, such as $RE_2SiO_5:Eu^{3+}$, a rare earth aluminate, such as $RE_3Al_5O_{12}:Eu^{3+}$, and a rare earth borate, such as $REBO_3:Eu^{3+}$ may be used. Note that RE represents at least one selected from the group consisting of Sc, Y, La, and Gd.

Examples of the $Eu^{3+}$ activated phosphor include phosphors based on an oxysulfide of a rare earth element (RE). Examples of such a phosphor include $RE_2O_2S:Eu^{3+}$.

Examples of the $Tb^{3+}$ activated phosphor include phosphors based on an oxide or a complex oxide of a rare earth element. As such a phosphor, at least one selected from the group consisting of a rare earth oxide, such as $RE_2O_3:Tb^{3+}$, a rare earth vanadate, such as $REVO_4:Tb^{3+}$ and $RE(P,V)O_4:Tb^{3+}$, a rare earth phosphate, such as $REPO_4:Tb^{3+}$, a rare earth silicate, such as $RE_2SiO_5:Tb^{3+}$, a rare earth aluminate, such as $RE_3Al_5O_{12}:Tb^{3+}$, and a rare earth borate, such as $REBO_3:Tb^{3+}$ may be used. Note that RE represents at least one selected from the group consisting of Sc, Y, La, and Gd.

Examples of the $Tb^{3+}$ activated phosphor include phosphors based on a complex nitride, a complex oxynitride, or a complex carbonitride of a rare earth element (RE). As such a phosphor, $Y_2Si_4N_6C:Tb^{3+}$ may be used. Examples of the $Tb^{3+}$ activated phosphor include phosphors based on an oxysulfide of a rare earth element (RE). As such a phosphor, $RE_2O_2S:Tb^{3+}$ may be used.

Examples of the $Mn^{4+}$ activated phosphor include phosphors based on germanate containing magnesium. As such a phosphor, $3.5MgO.0.5MgF_2.GeO_2:Mn^{4+}$ may be used. Examples of the $Mn^{4+}$ activated phosphor include an alkali metal complex fluoride. As such a phosphor, $K_2SiF_6:Mn^{4+}$ may be used.

The first phosphor contained in the first wavelength converter 20 is preferably a red phosphor that emits red fluorescence having a fluorescence peak within a wavelength range of 600 nm or more and less than 660 nm, particularly 610 nm or more and less than 640 nm. As a result, the output light of the light emitting device includes a red-based fluorescent component, and thus the light emitting device is advantageous in lighting applications requiring high color rendering, particularly, an average color rendering index Ra and a special color rendering index R9.

Examples of such a red phosphor include nitride phosphors activated by $Eu^{2+}$ and fluoride phosphors activated by $Me^{4+}$, and nitride phosphors are particularly preferable. Such a red phosphor has been researched for use in LED lighting and has high actual results, so that a light emitting device obtained has excellent reliability.

The first phosphor is preferably a powdered phosphor. Such a powdered phosphor is not only readily available, but also a wavelength converter can be manufactured by using an orthodox film-forming technique cultivated in conventional light source technology and display device technology. The light emitting device is thus advantageous in terms of industrial production.

The first phosphor contained in the first wavelength converter 20 is preferably a group of particles, and the average particle diameter of the first phosphor is preferably 15 μm or more and less than 50 μm. The average particle diameter of the first phosphor is more preferably 20 μm or more and less than 40 μm, further preferably 25 μm or more and less than 35 μm. When the first phosphor is a particle group of a plurality of particles and the average particle diameter of the phosphor is within the above range, the first phosphor in the first wavelength converter 20 efficiently absorbs the scattered laser light 100 and emits high intensity fluorescence.

In the present specification, the average particle diameter of the phosphor is obtained by observing the wavelength converter with a scanning electron microscope and measuring the particle diameter of multiple phosphors.

Further, the first wavelength converter 20 may be a sintered body as shown in Patent Literature 1, a polycrystalline phosphor, or a single crystal phosphor.

In the present embodiment, the first wavelength converter 20 is preferably made of only an inorganic compound. Accordingly, the first wavelength converter 20 has excellent thermal conductivity advantageous in heat radiation of the phosphor. As a result, the phosphor is excited by using the laser light 100 of high output, and thus a light emitting device easy to increase the output is obtained, Since there is no fear of burning of the first wavelength converter 20, it becomes possible to irradiate laser light having a relatively high energy density and to increase the output of the light emitting device.

As a wavelength converter made of an inorganic compound, at least one selected from the group consisting of a single crystal phosphor, a sintered body of a phosphor, a green compact of a phosphor, a structure in which phosphor particles are sealed with glass, a structure obtained by bonding phosphor particles with a binder and/or fine particles made of an inorganic compound, and a composite obtained by fusing a phosphor and a compound, may be used. Moreover, as the wavelength converter, a composite formed by combining these and other phosphor particles may be used. Note that examples of the composite formed by fusing a phosphor and a compound include a composite formed by fusing a phosphor and alumina.

The first wavelength converter 20 is preferably formed by sealing the first phosphor with a resin material. A wavelength converter obtained by sealing with a resin material is relatively easy to manufacture, and thus a desired wavelength converter is manufactured at low cost. As the resin material, a transparent organic material, such as silicone resin, may be used, for example.

It is not necessary to provide the first wavelength converter 20 on the entire inner surface of the right wall 4, the left wall 5, the front wall 6, and the rear wall 7 that are the side wall. In the light emitting device according to the present embodiment, the output and the chromaticity of the light emitting device are adjustable by the area of the first wavelength converter 20 provided on the inner surface of the side wall.

As shown in FIG. 1, in the light emitting device A, the first wavelength converter 20 is preferably not arranged on the optical axis of the laser light 100 with which the light diffusing layer 10 is directly irradiated. That is, the light diffusing layer 10 is arranged on a straight line of the center of the laser light source 1, but the first wavelength converter 20 is preferably not arranged thereon. Accordingly, the first phosphor is less likely to be irradiated with the laser light 100 of high density. Furthermore, the first phosphor is excited by sufficiently scattered low-density laser light 100, This makes easy to reduce the saturation of the fluorescence output of the first phosphor and to enhance the optical component emitted from the first phosphor.

(Light Diffusing Layer)

As described above, the bottom wall 3 of the housing 2A according to the present embodiment includes the light diffusing layer 10 that diffuses the laser light 100. The structure of the light diffusing layer 10 is not limited as long as it diffuses the laser light 100 inside the housing 2A. The light diffusing layer 10 may be a layer capable of reflecting the laser light 100, or a layer capable of transmitting the laser light 100.

The light diffusing layer 10 preferably contains a substance that diffuses and reflects light, and preferably contains an inorganic particle group made of an inorganic substance. By using such an inorganic particle group, the laser light 100 is reflected and scattered.

The average particle diameter of the inorganic particles is more preferably 1 μm or more and less than 100 μm. The inorganic particles are a group of particles made of multiple particles, and the average particle diameter of the inorganic particles is within the above range, so that an irradiation surface (surface 10a) with the laser light 100 in the light diffusing layer 10 has an increased number of irregularities per unit area. The number of inorganic particles per unit depth in the light diffusing layer 10 also increases. Therefore, the laser light 100 is easily scattered by the light diffusing layer 10, and the degree of scattering of the laser light 100 increases. As a result, the light diffusing layer 10 generates scattered laser light having a small power density with respect to the first wavelength converter 20. For this reason, even when the light diffusing layer 10 is irradiated with the strong laser light 100, the first phosphor is unlikely to cause saturation of the fluorescence output, so that the output of the light emitting device is increased.

In the present specification, the average particle diameter of the inorganic particles is obtained by observing the light diffusing layer 10 with a scanning electron microscope and measuring the particle diameter of multiple inorganic particles.

In the present embodiment, the light diffusing layer 10 desirably has a high reflectance with respect to the laser light 100 and the fluorescence emitted from the first phosphor. The reflectance of the laser light 100 and that of the fluorescence emitted from the first phosphor are preferably 90% or more. When these reflectances are as high as possible, the emission efficiency of the light emitting device is increased, which is preferable.

It is not necessary to provide the light diffusing layer 10 on the entire inner surface of the bottom wall 3. In the light emitting device according to the present embodiment, the output and the chromaticity of the light emitting device are adjustable by the area of the light diffusing layer 10 provided on the inner surface of the bottom wall 3.

In the present embodiment, the light diffusing layer 10 is preferably made of only an inorganic substance. In this case, even when irradiated with the laser light 100 having high energy intensity, the light diffusing layer 10 hardly changes in quality, so that a light emitting device suitable for high output is obtained. Examples of the light diffusing body made only of an inorganic substance include a single crystal of an inorganic compound, a sintered body of an inorganic compound, a green compact of an inorganic compound, a structure in which inorganic compound particles are sealed with glass, a structure obtained by bonding inorganic compound particles with an binder or fine particles, and a composite obtained by fusing multiple types of inorganic compounds.

The light diffusing layer 10 preferably contains an inorganic powder having translucency in at least a part thereof. Such a light diffusing layer 10 is manufactured relatively easily by using an orthodox inorganic powder and thus is advantageous for industrial production. By using an inorganic powder having translucency, a light diffusing layer obtained has relatively high diffusibility and reflectance.

In the present embodiment, the light diffusing layer 10 is preferably a light diffusing body containing non-luminescent inorganic particles, and the first wavelength converter 20 is preferably excited by diffusion light diffused by irradiating the light diffusing layer 10 with laser light. As described above, the light diffusing layer 10 only needs to diffuse the laser light 100 inside the housing 2A, and thus non-luminous particles are suitably used as the inorganic particles.

In other words, the light diffusing layer 10 is preferably a light diffusing body containing no phosphor. In this case, the light diffusing layer 10 becomes a light diffusing body in which wavelength conversion by the phosphor does not occur, and thus heat generation due to energy loss in wavelength conversion is less likely to occur. Accordingly, even when the light diffusing layer 10 is irradiated with the laser light 100 having high energy intensity, the temperature of the light diffusing layer 10 is less likely to increase, and a light emitting device obtained is suitable for high output.

As the non-luminescent inorganic particles, a metal oxide is preferably used. For example, at least one of alumina or zirconia is preferably used. The light diffusing layer 10 is preferably an aggregate of metal oxide particles. Use of an aggregate of metal oxide particles as the light diffusing layer 10 is preferable because relatively high diffusibility and reflectance are obtained. Furthermore, at least one of barium sulfate or metal particles may be used as the non-luminescent inorganic particles. The metal particles is used in various forms, such as a plate shape and a thin film shape.

The light diffusing layer 10 may contain organic particles at least in a part thereof.

In the present embodiment, the light diffusing layer 10 is preferably a second wavelength converter containing a second phosphor, and the first wavelength converter 20 is preferably excited by diffused light diffused by irradiating the light diffusing layer 10 with the laser light 100. Since the light diffusing layer 10 contains the second phosphor, the second phosphor absorbs the laser light 100 and emits fluorescence. Accordingly, output light obtained by additively mixing the laser light 100 and fluorescence emitted from the first phosphor and the second phosphor is emitted.

The second phosphor is preferably a $Ce^{3+}$ activated phosphor. $Ce^{3+}$ is an emission center having the shortest emission lifetime ($10^{-8}$ to $10^{-7}$s) among rare earth ions, and thus electronic energy of the phosphor in the excited state is relaxed in an extremely short time in the $Ce^{3+}$ activated phosphor. For this reason, in the $Ce^{3+}$ activated phosphor, the electronic energy of the phosphor in the excited state is relaxed in an extremely short time even under high density excitation by laser light irradiation. Accordingly, saturation of fluorescence is controlled by using $Ce^{3+}$ activated phosphor as the phosphor contained in the light diffusing layer 10. Note that the fluorescence saturation is a saturation phenomenon of light output due to an increase in the number of electrons in the excited state.

The stable valence of rare earth ions is trivalent, and $Ce^{3+}$ is an emission center having a stable trivalent valence. For this reason, the $Ce^{3+}$ activated phosphor hardly has deterioration of the phosphor crystal due to oxidation even when the phosphor generates heat by high-density excitation by laser light irradiation, and long-term reliability is enhanced. The $Ce^{3+}$ activated phosphor described above may be used.

In the light emitting device A having the above-described structure, the laser light 100 emitted from the laser light source 1 passes through the aperture 8 of the housing 2A, enters the internal space, and then reaches the light diffusing layer 10. At this time, the laser light 100 is reflected by the surface 10a of the light diffusing layer 10 and/or the upper surface 3a of the bottom wall 3. The reflected laser light 100 reaches each first wavelength converter 20 held by the right wall 4, the left all 5, the front wall 6, and the rear wall 7. At this time, a part of the laser light 100 is absorbed by the first phosphor contained in the first wavelength converter 20 and converted into an optical component 100A.

A part of the laser light 100 reflected by the light diffusing layer 10 and/or the bottom wall 3 is absorbed by the first phosphor, and a part of the laser light 100 is reflected by the first wavelength converter 20 and/or by the right wall 4, the left wall 5, the front wall 6, and the rear wall 7. Then, output light obtained by additively mixing the laser light 100 and the optical component 100A emitted from the first phosphor is emitted through the aperture 8 of the housing 2A.

As described above, in the light emitting device A, the light diffusing layer 10 is directly irradiated with the laser light 100 while the first phosphor is not directly irradiated with the laser light 100, and the first phosphor is irradiated with scattered light of the laser light 100. Since the laser light 100 is once diffused by the light diffusing layer 10, the power density of the laser light 100 is extremely reduced. Then, each first wavelength converter 20 in multiple places is irradiated with the divided diffused laser light 100, and thus the irradiation power density to the first wavelength converter 20 further decreases. As a result, it becomes easy to control the fluorescence output saturation of the first phosphor contained in the first wavelength converter 20, and the conversion efficiency of the laser light 100 is maintained high.

In addition, in the process in which the first wavelength converter 20 converts the laser light 100 into fluorescence, a part of the energy of the laser light 100 may become heat. However, the laser light 100 emitted to the first wavelength converter 20 has a reduced power density, and the heat generation during conversion into fluorescence is thus controlled. This lowers the saturation phenomenon of light output due to temperature quenching of the first phosphor. Further, when the laser light 100 is diffused by the light diffusing layer 10, the laser light 100 loses its straightness and directivity and becomes to have an isotropic orientation distribution similar to that of fluorescence. Accordingly, it becomes easy to improve the color uniformity of the output light obtained by additively mixing the laser light 100 and the optical component 100A emitted from the first phosphor.

Note that the above-described "to directly irradiate the light diffusing layer 10 with the laser light 100 without directly irradiating the first phosphor with the laser light 100" means that the laser light 100 is emitted to the light diffusing layer 10 prior to the first phosphor.

As described above, the aperture 8 of the housing 2A is a place through which the laser light 100 enters and is also a place through which the output light including the diffused laser light 100 and the optical component 100A emitted from the first phosphor is emitted. The output light becomes light exhibiting a predetermined color tone by adjusting the wavelength or the intensity ratio of the laser light 100 and the optical component 100A. Moreover, the spot diameter of the output light is freely changed by adjusting the area of the aperture 8. For example, when the area of the aperture 8 is large, it is suitably used as a light emitting device for a lighting equipment with little glare. When the area of the aperture 8 is small, it is suitably used as a light emitting device for projectors or displays having high luminance.

The chromaticity of the output light is freely adjusted by the material, area, thickness, or the like of the first wavelength converter 20. Furthermore, the ratio of the diffused laser light 100 to the optical component 100A is also adjusted by the area of the aperture 8 or the height of the first wavelength converter 20. Accordingly, the light output of the light emitting device A has both high chromaticity flexibility and high color uniformity.

Further, in the housing 2A, the bottom wall 3 holds the light diffusing layer 10, and the side wall holds the first wavelength converter 20. Thus, the structure is easy to design the heat radiation of the first wavelength converter 20 having a property of heat generation in wavelength conversion. Accordingly, a light emitting device obtained easily controls the decrease in efficiency due to temperature quenching of the first phosphor and is suitable for high output. Moreover, there are more choices of the first phosphor available to achieve higher output, and phosphors having high actual results for LED lighting are used without difficulty, so that the color tone of the output light is easily adjusted.

As described above, the light emitting device A according to the present embodiment includes the laser light source 1 that emits the laser light 100, the housing 2A having the bottom wall 3 and the side wall, and the first wavelength converter 20 provided on the side wall and containing the first phosphor. The laser light source 1 irradiates the bottom wall 3 of the housing 2A with the laser light 100. The first phosphor is excited by the diffused light of the laser light 100 diffused by the bottom wall 3. Further, in the light emitting device A, it is preferable to directly irradiate the bottom wall 3 of the housing 2A with the laser light 100 without directly irradiating the first wavelength converter 20 with the laser light 100. Thus, the conversion efficiency of the laser light 100 is improved while the power density of the laser light 100 is increased, and further the color uniformity and chromaticity flexibility of the output light are improved.

In the light emitting device A, when the bottom wall 3 has a structure capable of diffusing the laser light 100, the light diffusing layer 10 is not an essential component. However, the bottom wall 3 preferably includes the light diffusing layer 10 from the viewpoint of efficiently diffusing the laser light 100 and reducing the power density.

In the light emitting device A, a light reflecting film may be interposed between the first wavelength converter 20 and the side wall. The light reflecting film reflects the diffused laser light 100 and the fluorescence emitted from the first phosphor. As the light reflecting film, a metal film is preferably used, and a film made of silver or aluminum is more preferably used. Provision of such a light reflecting film further improves the conversion efficiency of the laser light 100 and the extraction efficiency of the output light.

In the light emitting device A, a lens for condensing the laser light 100 emitted from the laser light source 1 on the light diffusing layer 10 may be interposed between the laser light source 1 and the housing 2A. A light guiding mechanism for transmitting and condensing the laser light 100 emitted from the laser light source 1 on the light diffusing layer 10 may be interposed between the laser light source 1 and the housing 2A, As the light guiding mechanism, an optical fiber may be used, for example.

In the light emitting device A shown in FIG. 1, the laser light source 1 is positioned directly above the housing 2A, but the light emitting device A is not limited to such a mode. For example, the laser light source 1 may be positioned other than directly above the light emitting device A, and the optical path of the laser light 100 may be changed by a mirror or the like. In this case, as described above, the laser light 100 does not necessarily have to propagate in space, and a predetermined light guiding mechanism, such as an optical fiber, may be provided as a part of the way of entering the housing 2A from the laser light source 1.

In the light emitting device A, the output light is preferably utilized as an illumination light. Thus, the light emitting device A has high industrial utility value and high demand. The light emitting device A is preferably used for any of the following purposes: outdoor lighting, store lighting, light control system, facility lighting, marine lighting, and endoscopes. As a matter of course, the light emitting device A may use IoT or AI that has recently made remarkable progress in technology.

Second Embodiment

Next, a light emitting device according to a second embodiment is described in detail with reference to the drawings. Note that the same components as those of the light emitting device according to the first embodiment are denoted by the same reference numerals, and redundant descriptions are omitted.

Figure 2:
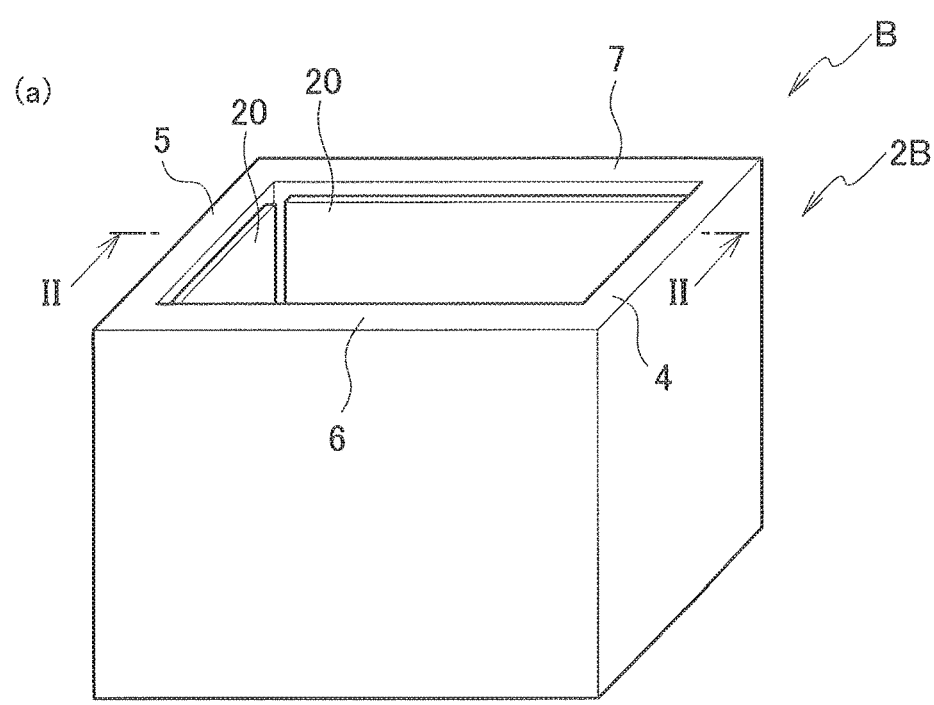
FIG. 2 is a schematic diagram illustrating an example of a light emitting device according to a second embodiment.
Figure 2:
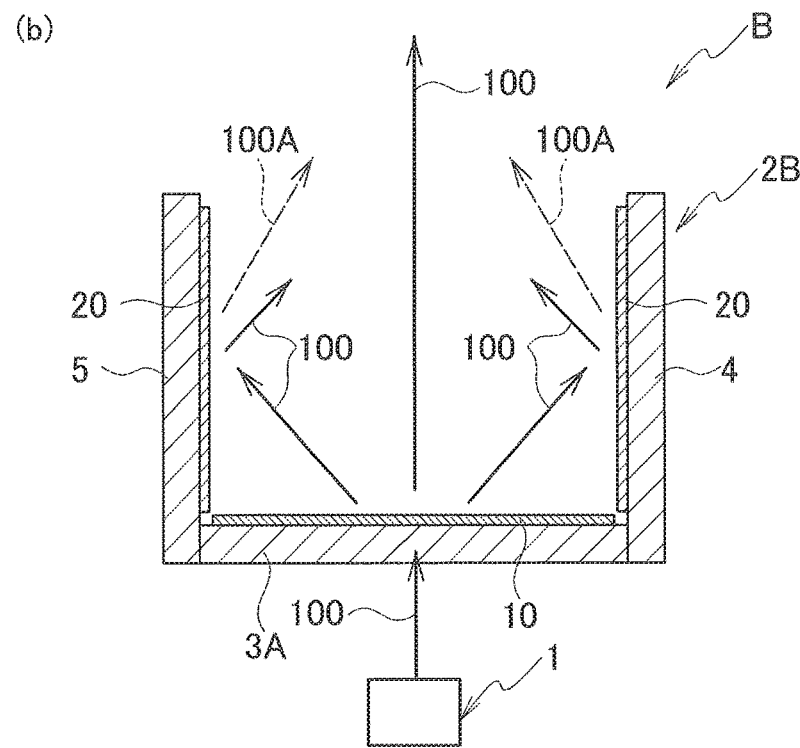

As shown in FIG. 2, a light emitting device B according to the present embodiment includes a laser light source 1 that emits laser light, and a housing 2B that includes a bottom wall 3A and a side wall. The housing 2B includes first wavelength converters 20 provided on the side wall. The first wavelength converters 20 contain a first phosphor. The housing 2B includes the bottom wall 3A, and the side wall including a right wall 4, a left wall 5, a front wall 6, and a rear wall 7. The housing 2B has a substantially rectangular parallelepiped shape when viewed from the outside. The housing 2B has an internal space partitioned by the bottom wall 3A, the right wall 4, the left wall 5, the front wall 6, and the rear wall 7. The housing 2B has an aperture 8 on the upper surface, and the aperture 8 communicates with the internal space.

The light emitting device A according to the first embodiment has a structure called a reflection type. That is, the light emitting device A emits output light in a direction in which the laser light 100 is reflected by the light diffusing layer 10 and/or the bottom wall 3A in contrast, the light emitting device B according to the present embodiment has a structure called a transmission type. That is, the light emitting device B emits output light in a direction in which the laser light 100 passes through the light diffusing layer 10 and the bottom wall 3A.

As shown in FIG. 2, in the light emitting device B, the laser light 100 emitted from the laser light source 1 passes through the bottom wall 3A of the housing 2B and reaches the light diffusing layer 10. At this time, the laser light 100 is scattered by the inorganic particles while passing through the light diffusing layer 10. The scattered laser light 100 reaches each first wavelength converter 20 held by the right wall 4, the left wall 5, the front wall 6, and the rear wall 7. At this time, a part of the laser light 100 is absorbed by the first phosphor contained in the first wavelength converter 20 and converted into the optical component 100A.

A part of the laser light 100 scattered by the light diffusing layer 10 is absorbed by the first phosphor, and a part of the laser light 100 is reflected by the first wavelength converters 20 and/or the right wall 4, the left wall 5, the front wall 6, and the rear wall 7. Then, output light obtained by additively mixing the laser light 100 and the optical component 100A emitted from the first phosphor is emitted through the aperture 8 of the housing 2B.

In the light emitting device B of a transmission type, the bottom wall 3A of the housing 2B is preferably made of a translucent member that transmits the laser light 100, and the laser light 100 preferably enters the internal space from the bottom wall 3A of the housing 2B. By using a translucent member as the bottom wall 3A, the laser light 100 is scattered by the light diffusing layer 10, and the first wavelength converter 20 is efficiently excited by the scattered light.

The translucent member is preferably a substrate that trans s at least the laser light 100, and preferably a substrate made of sapphire, for example. Since sapphire has high transmittance in the visible light region and relatively high heat radiation, the conversion efficiency of the laser light 100 and the heat radiation of the light emitting device are efficiently increased.

Figure 3:
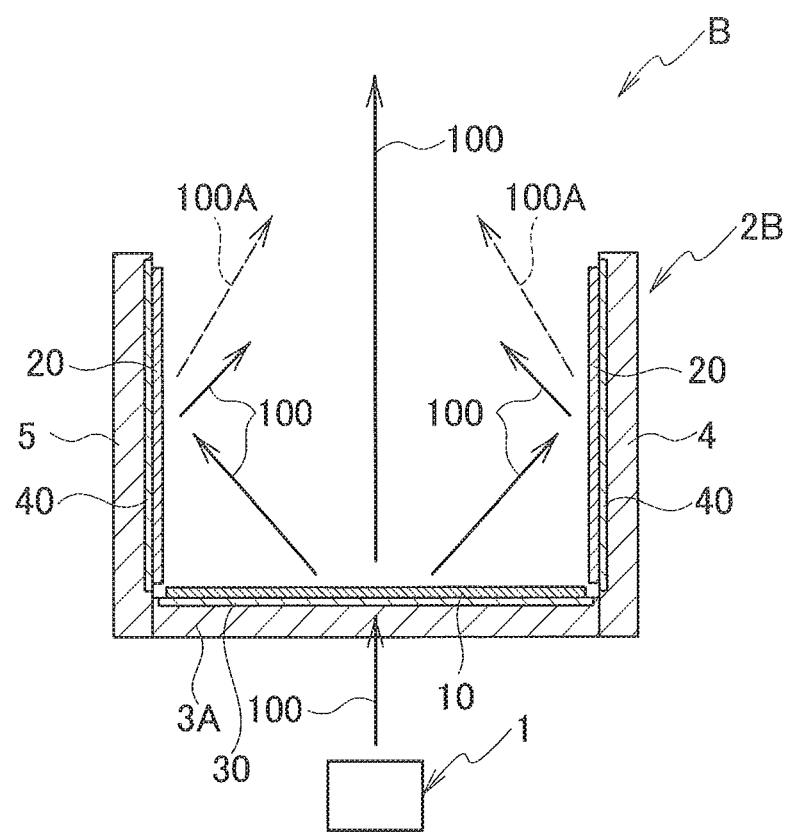
FIG. 3 is a cross-sectional view of another example of the light emitting device according to the second embodiment.

As shown in FIG. 3, in the light emitting device B, a wavelength selective reflector 30 may be provided between the light diffusing layer 10 and the bottom wall 3A. The wavelength selective reflector 30 is a film that has transparency for a light having a specific wavelength range but has reflectivity for a light having other wavelength ranges. Examples of the wavelength selective reflector 30 include a film that has transparency for a blue wavelength range but has reflectivity for visible light wavelength ranges other that the blue wavelength range. By using such a wavelength selective reflector 30, light having a specific wavelength that is easily absorbed by the first wavelength converter 20 is preferentially made incident on and diffused by the light diffusing layer 10. This further enhances the output of the light emitting device and the conversion efficiency of the incident light. As the wavelength selective reflector 30, for example, a dichroic mirror may be used. The dichroic mirror is a laminate of thin films having different refractive indices and obtains desired transmission and reflection characteristics.

As shown in FIG. 3, in the light emitting device B, light reflecting films 40 may be interposed between the first wavelength converters 20 and the side wall. The light reflecting films 40 reflect the diffused laser light 100 and the fluorescence emitted from the first phosphor. As the light reflecting film 40, a metal film is preferably used, and a film made of silver or aluminum is more preferably used. Provision of such light reflecting films 40 further improves the conversion efficiency of the laser light 100 and the extraction efficiency of the output light.

As described above, the light emitting device B according to the present embodiment includes the laser light source 1 that emits the laser light 100, the housing 2B that includes the bottom wall 3A and the side wall, and the first wavelength converter 20 provided on the side wall and containing the first phosphor. The laser light source 1 irradiates the bottom wall 3A of the housing 2B with the laser light 100. The laser light 100 enters the internal space through the bottom wall 3A of the housing 2B and is scattered by the light diffusing layer 10. The first phosphor is excited by the diffused light of the laser light 100 diffused by the bottom wall 3A. This improves the conversion efficiency of the laser light 100 while increasing the power density of the laser light 100 and further enhances the color uniformity and chromaticity flexibility of the output light.

In FIGS. 1 to 3, the housing 2A of the light emitting device A and the housing 2B of the light emitting device B are each illustrated as a substantially rectangular parallelepiped having an opening, that is a so-called square-shaped structure. However, the housings 2A and 2B are not limited to such a shape, and the above-described effects are achieved even when they are cylindrical or polygonal as described later.

Third Embodiment

Next, a light emitting device according to a third embodiment is described in detail with reference to the drawings.

Note that the same components as those of the light emitting devices according to the first and the second embodiments are denoted by the same reference numerals, and redundant descriptions are omitted.

As described above, the light emitting devices A and B according to the first and second embodiments include the housings 2A and 2B that include the bottom walls 3 and 3A, and the side wall including the right wall 4, the left wall 5, the front wall 6, and the rear wall 7 and have a substantially rectangular parallelepiped shape when viewed from the outside. However, the shape of the housing used in the light emitting device according to the present embodiment is not limited to such a substantially rectangular parallelepiped shape, and shapes shown in FIGS. 4 to 7 may be used. The laser light source 1 is omitted in FIGS. 4 to 7.

Figure 4:
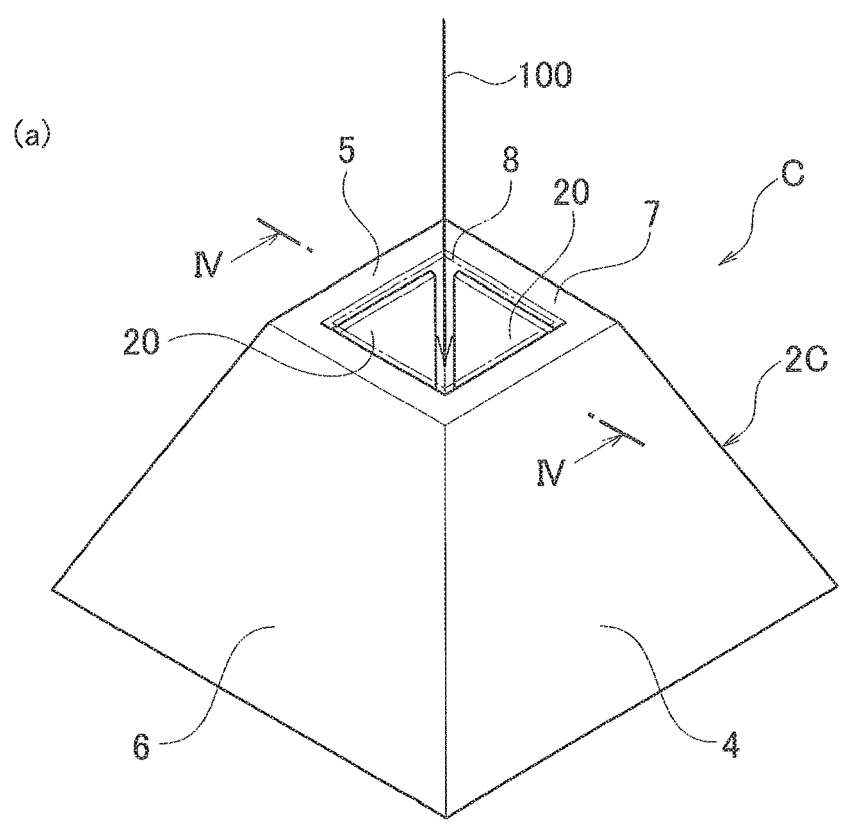
FIG. 4 is a schematic diagram illustrating an example of a light emitting device according to a third embodiment.
Figure 4:
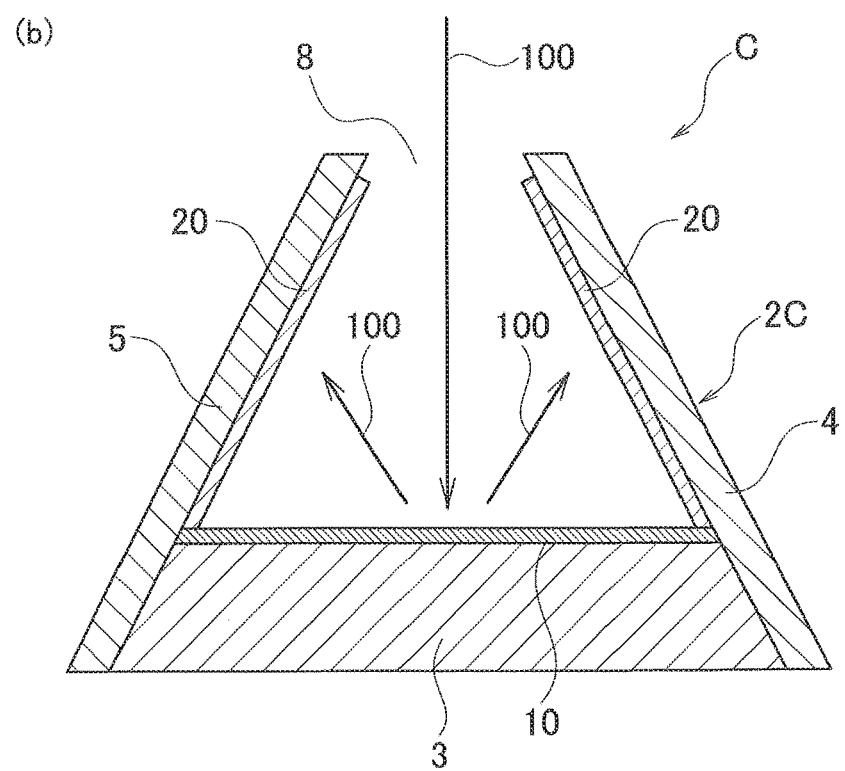

FIG. 4 shows a modification of the light emitting device of the reflection type. A light emitting device C shown in FIG. 4 includes a housing 2C that includes a bottom wall 3 and a side wall including a right wall 4, a left wall 5, a front wall 6, and a rear wall 7. The housing 2C has a substantially truncated pyramid shape when viewed from the outside and has an open upper surface. In the housing 2C, the bottom wall 3 holds a light diffusing layer 10, and the right wall 4, the left wall 5, the front wall 6, and the rear wall 7 hold first wavelength converters 20.

In the light emitting device C, the laser light 100 emitted from the laser light source 1 passes through the aperture 8 of the housing 2C, enters the internal space, and then reaches the light diffusing layer 10 to be reflected. The reflected laser light 100 reaches the first wavelength converters 20 and is converted into an optical component 100A. Then, output light obtained by additively mixing the laser light 100 and the optical component 100A emitted from the first phosphor is emitted from the aperture 8 of the housing 2C.

As shown in FIG. 4, when viewed along the optical axis of the laser light 100 emitted from the laser light source 1 toward the bottom wall 3, the area of the aperture 8 communicating with the internal space of the housing 2C is preferably smaller than the area of the light diffusing layer 10. When the area of the aperture 8 is smaller than that of the light diffusing layer 10, even when the first wavelength converters 20 have a conspicuous body color, the first wavelength converters 20 are substantially invisible from the outside of the housing 2C. This eliminates discomfort in appearance and provides a light emitting device excellent in design. When the area of the aperture 8 is smaller than that of the light diffusing layer 10, the laser light 100 is scattered in the internal space of the housing 2C and is easily absorbed by the first wavelength converters 20. Accordingly, the light emitting device emits output light that contains a relatively large amount of fluorescent components emitted by the first wavelength converters 20.

Figure 5:
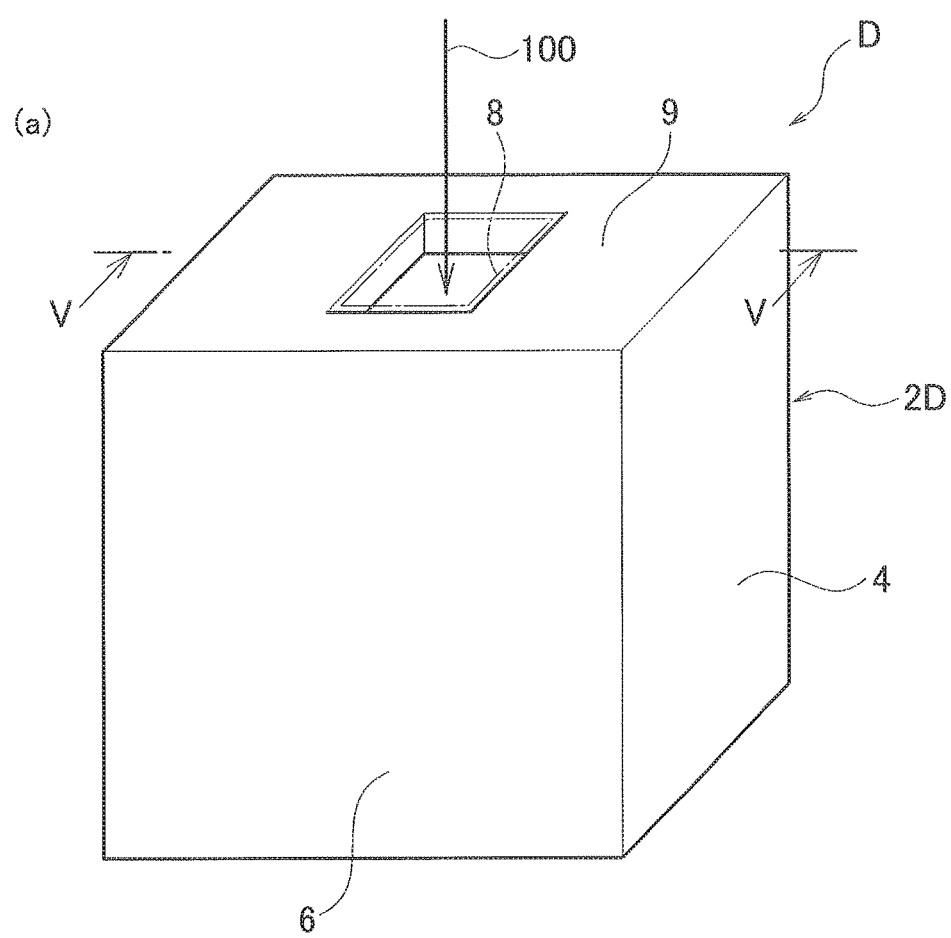
FIG. 5 is a schematic diagram illustrating another example of the light emitting device according to the third embodiment.
Figure 5:
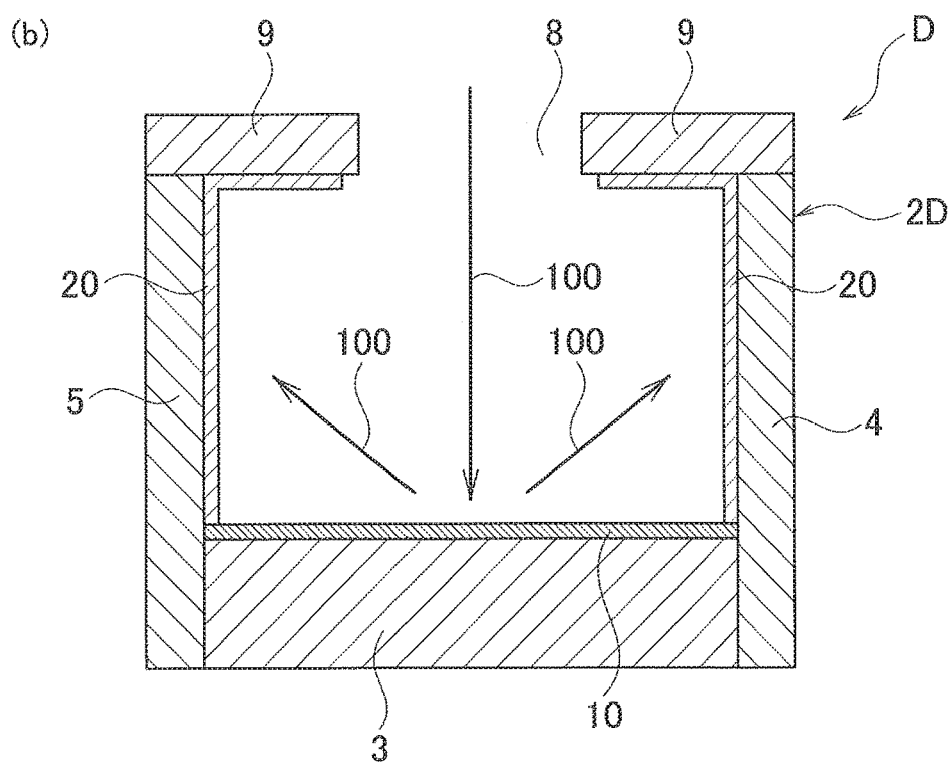

Similarly to the light emitting device A shown in FIG. 1, a light emitting device D shown in FIG. 5 includes a housing 2D in a substantially rectangular parallelepiped shape. The housing 2D includes a bottom wall 3, and a right wall 4, a left wall 5, a front wall 6 and a rear wall 7 provided to surround the bottom wall 3. The housing 2D further includes an upper wall 9 to cover a part of its upper surface. The upper wall 9 has an aperture 8 formed therein, the aperture 8 communicating with the internal space. In the internal space of the housing 2D, the bottom wall 3 holds a light diffusing layer 10, and the right wall 4, the left wall 5, the front wall 6, and the rear wall 7 hold a first wavelength converter 20. The upper wall 9 also holds the first wavelength converter 20.

Similarly to the light emitting device C, in the light emitting device D, the laser light 100 emitted from the laser light source 1 passes through the aperture 8 of the housing 2C, enters the internal space, and then reaches the light diffusing layer 10 to be reflected. The reflected laser light 100 reaches the first wavelength converter 20 and is converted into an optical component 100A. Then, output light obtained by additively mixing the laser light 100 and the optical component 100A emitted from the first phosphor is emitted from the aperture 8.

As shown in FIG. 5, when viewed along the optical axis of the laser light 100 emitted from the laser light source 1 toward the bottom wall 3, the area of the aperture 8 leading to the internal space of the housing 2D is smaller than the area of the light diffusing layer 10. Similarly to the light emitting device C in FIG. 4, this provides a light emitting device excellent in design and emits output light that contains a relatively large number of fluorescent components emitted by the first wavelength converter 20.

Figure 6:
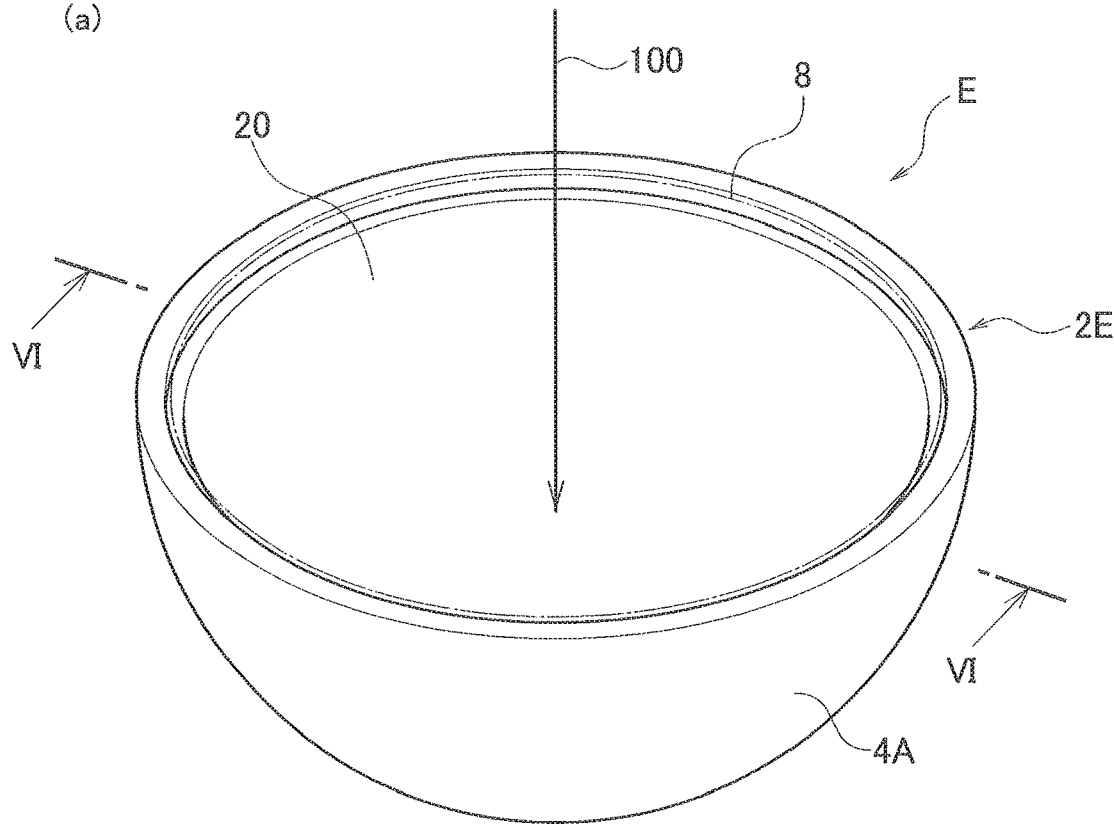
FIG. 6 is a schematic diagram illustrating still another example of the light emitting device according to the third embodiment.
Figure 6:
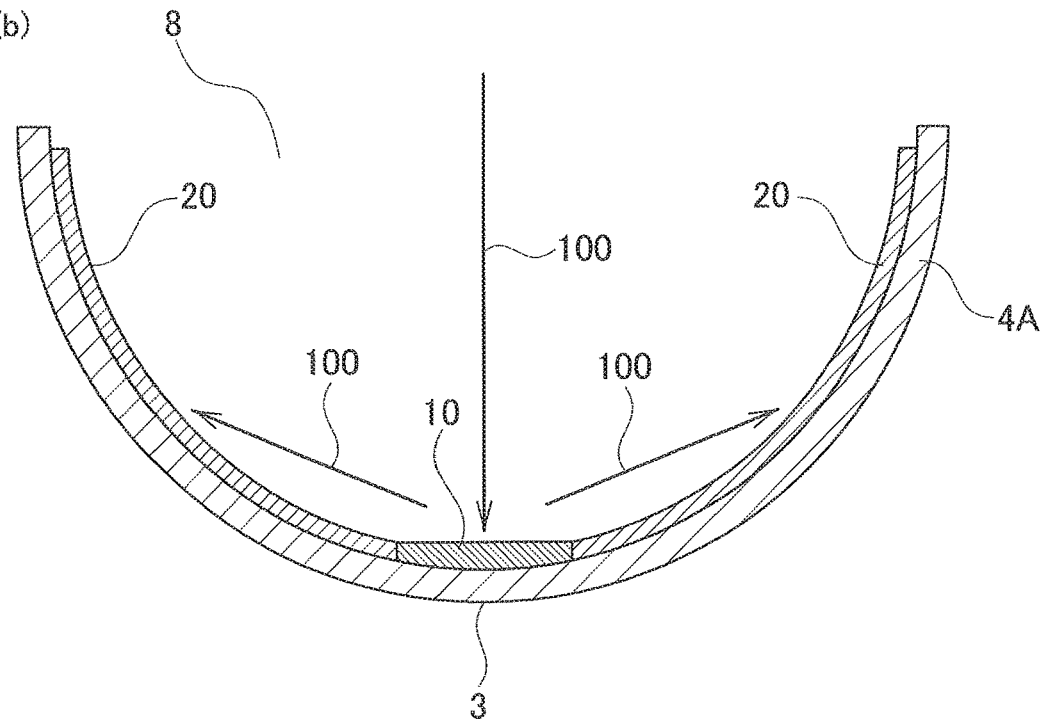

A light emitting device E shown in FIG. 6 includes a housing 2E in a substantially hemispherical shape. The housing 2E includes a bottom wall 3 and a side wall 4A provided to surround the bottom wall 3. In the internal space of the housing 2E, the bottom wall 3 holds a light diffusing layer 10, and the side wall 4A holds a first wavelength converter 20. In the housing 2E, the boundary between the bottom wall 3 and the side wall 4A is not clear, and the bottom wall 3 and the side wall 4A are formed in one body.

Similarly to the light emitting device C, in the light emitting device F, the laser light 100 emitted from the laser light source 1 passes through the aperture 8 of the housing 2E, enters the internal space, and then reaches the light diffusing layer 10 to be reflected. The reflected laser light 100 reaches the first wavelength converter 20 and is converted into an optical component 100A. Then, output light obtained by additively mixing the laser light 100 and the optical component 100A emitted from the first phosphor is emitted from the aperture 8.

As shown in FIG. 6, when viewed along the optical axis of the laser light 100 emitted from the laser light source 1 toward the bottom wall 3, the area of the aperture 8 communicating with the internal space of the housing 2E is preferably larger than the area of the light diffusing layer 10. When the area of the aperture 8 is larger than that of the light diffusing layer 10, the laser light 100 diffused by the light diffusing layer 10 is almost uniformly emitted to the first wavelength converter 20 and converted into the optical component 100A. Accordingly, the light emitting device F emits output light with less color irregularity.

Figure 7:
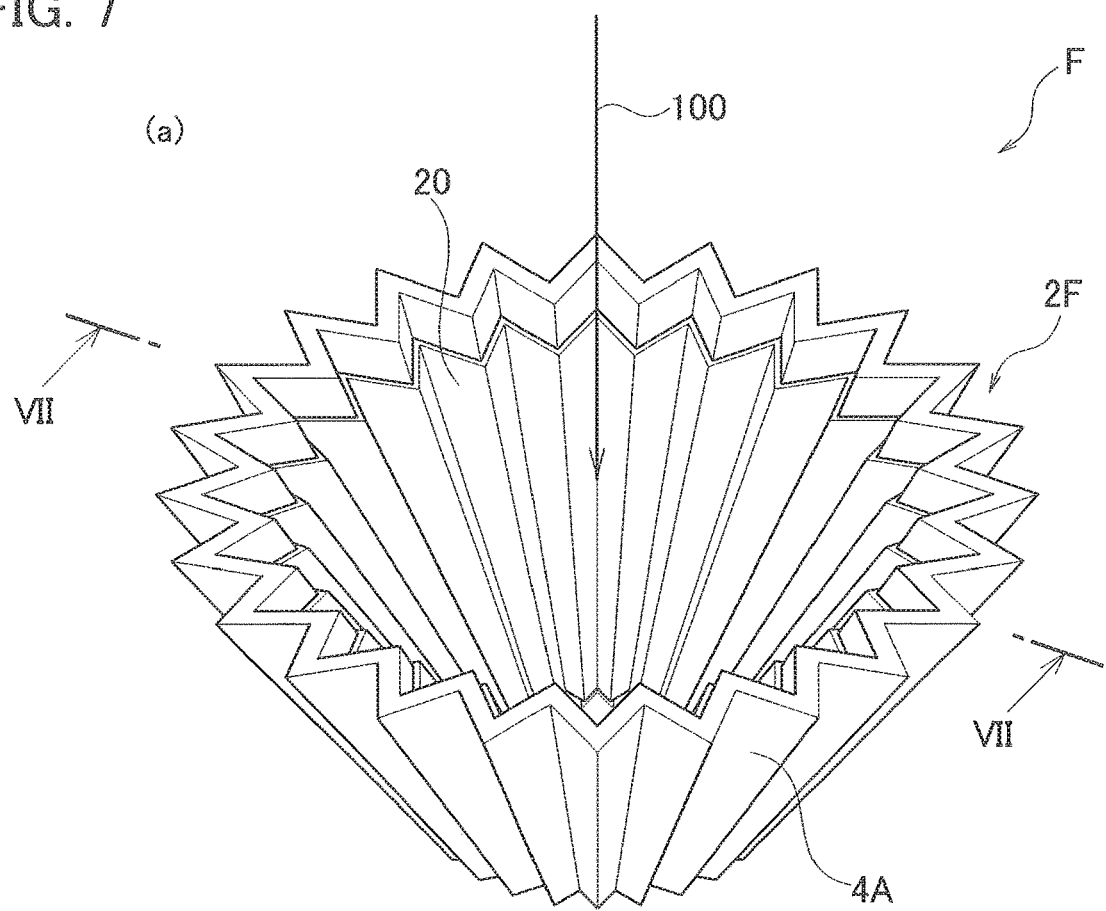
FIG. 7 is a schematic diagram illustrating still another example of the light emitting device according to the third embodiment.
Figure 7:
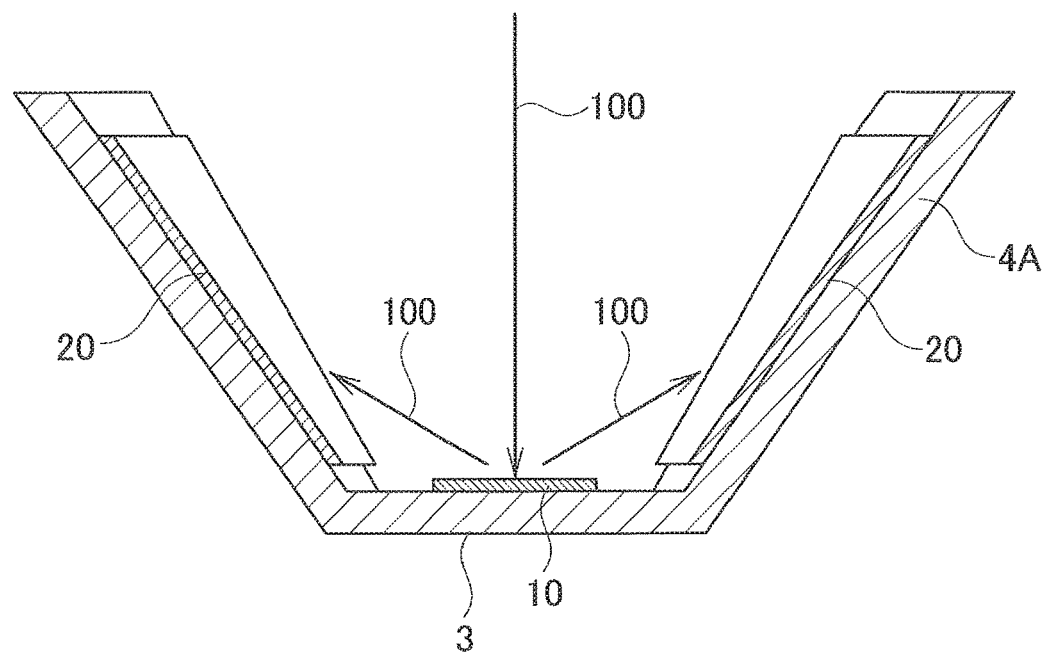

A light emitting device F shown in FIG. 7 includes a housing 2F in a substantially polygonal frustum shape. The housing 2F includes a bottom wall 3, and a side wall 4A provided to surround the bottom wall 3. In the internal space of the housing 2F, the bottom wall 3 holds a light diffusing layer 10, and the side wall 4A holds a first wavelength converter 20.

Similarly to the light emitting device C, in the light emitting device F, the laser light 100 emitted from the laser light source 1 passes through the aperture 8 of the housing 2F, enters the internal space, and then reaches the light diffusing layer 10 to be reflected. The reflected laser light 100 reaches the first wavelength converter 20 and is converted into an optical component 100A. Then, output light obtained by additively mixing the laser light 100 and the optical component 100A emitted from the first phosphor is emitted from the aperture 8.

As shown in FIG. 7, when viewed along the optical axis of the laser light 100 emitted from the laser light source 1 toward the bottom wall 3, the area of the aperture 8 communicating with the internal space of the housing 2F is larger than the area of the light diffusing layer 10. Accordingly, the light emitting device F emits output light with less color irregularity. Further, the side wall 4A of the housing 2F has multiple folds, thereby increasing the surface area of the first wavelength converter 20 held by the side wall 4A. Accordingly, the light emitting device F emits high output light while reducing the size of the housing 2F.

The light emitting devices shown in FIGS. 4 to 7 are the reflection type. However, they are not limited to such an aspect and may be the transmission type described in the second embodiment. The housings of the light emitting devices shown in FIG. 4 and FIG. 7 each have a polygonal frustum shape. However, they are not limited to such an aspect, and housings may have a shape of a frustum of circular cone. The housings of the light emitting devices shown in FIGS. 1, 2, 3, and 5 each have a substantially rectangular parallelepiped shape. However, they are not limited to such an aspect and may have a substantially cylindrical shape.

Fourth Embodiment

Next, a light emitting device according to a fourth embodiment is described in detail with reference to the drawings. Note that the same components as those of the light emitting devices according to the first to the third embodiments are denoted by the same reference numerals, and redundant descriptions are omitted.

As described in the second embodiment, in the light emitting device B of the transmission type, the laser light 100 emitted from the laser light source 1 passes through the bottom wall 3A of the housing 2B and reaches the light diffusing layer 10 to be scattered. A part of the scattered laser light 100 is absorbed by the first phosphor contained in the first wavelength converter 20 and converted into the optical component 100A. As a result, in the light emitting device B, output light obtained by additively mixing the laser light 100 and the optical component 100A emitted from the first phosphor is emitted through the aperture 8 of the housing 2B. In such a light emitting device B, for example, output light having a desired light color is obtained by changing the material, area, thickness, or the like of the first wavelength converter 20.

The light emitting device according to the present embodiment is preferably provided with a light guiding mechanism that is interposed between the laser light source 1 and the housing 2B and guides the laser light 100 emitted from the laser light source 1 to the bottom wall 3A. Further, the light guiding mechanism preferably includes a detachable connecting portion. Thus, only the housing 2B, or the housing 2B and a part of the light guiding mechanism is detachable from the laser light source 1. Accordingly, only the housing 2B, or the housing 2B and a part of the light guiding mechanism can be replaced with another one, and the housing 2B can obtain the light color of the output light according to application and preference. Moreover, it becomes easy to reuse the laser light source 1 and/or the light guiding mechanism, which is often configured by using a lot of relatively expensive members. Thus, a light emitting device obtained is friendly to the environment and excellent in economic efficiency.

Figure 8:
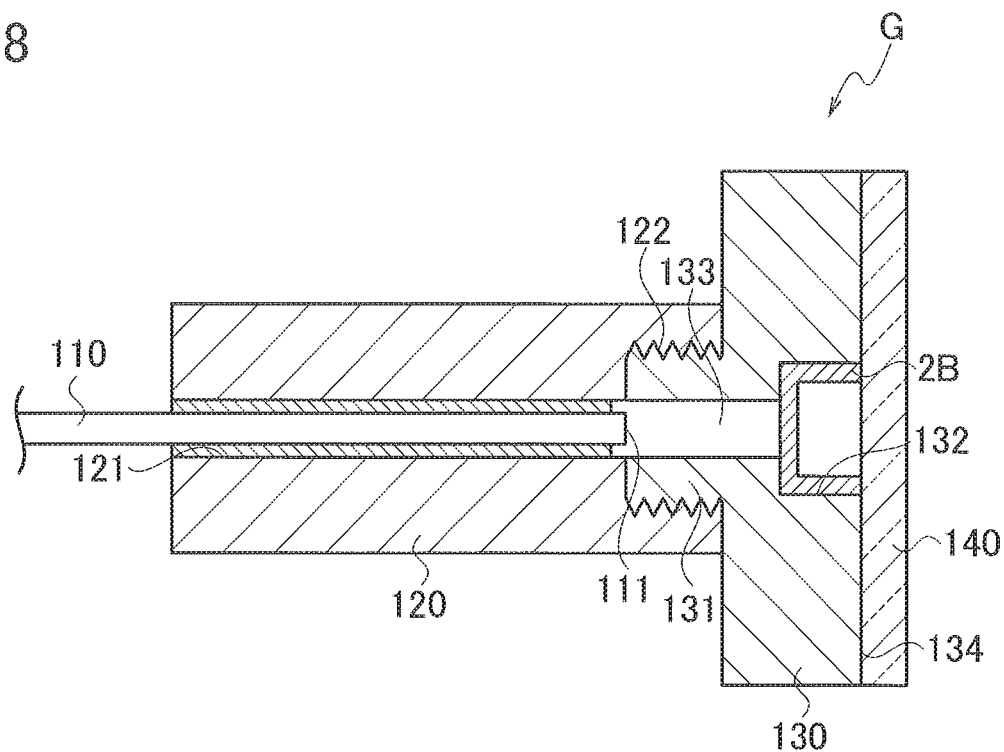
FIG. 8 is a schematic cross-sectional view of an example of a light emitting device according to a fourth embodiment.

Specifically, as shown in FIG. 8, a light emitting device G includes the light guiding mechanism provided between the laser light source 1 and the housing 2B, The light guiding mechanism includes an optical fiber 110 that emits laser light 100 toward the bottom wall 3A of the housing 2B, and an optical fiber support 120 that supports the periphery of a light emitting part 111 that is the tip of the optical fiber 110. At the center of the optical fiber support 120, a long hole-shaped support 121 that holds the outer periphery of the optical fiber 110 is formed. The optical fiber support 120 includes an engaged recess 122 that engages with an engaging protrusion 131 provided on a housing support 130 as described later.

The light guiding mechanism further includes the housing support 130 that supports the housing 2B, The housing support 130 includes a recess 132 for embedding the housing 2B, and a hollow space 133 for guiding the laser light 100 emitted from the light emitting part 111 of the optical fiber 110 to the bottom wall 3A of the housing 2B. The housing support 130 further includes the engaging protrusion 131 that engages with the engaged recess 122 of the optical fiber support 120, and the hollow space 133 is formed at the center of the engaging protrusion 131. The housing support 130 is provided with a protective film 140 on a surface 134 thereof to which output light is emitted from the housing 2B. The structure of the protective film 140 is not limited as long as it transmits the output light from the housing 2B.

In the light emitting device G, the light guiding mechanism includes the optical fiber support 120 and the housing support 130 that are the connecting portion. The optical fiber support 120 and the housing support 130 are configured to be detachable through the engaged recess 122 and the engaging protrusion 131. Accordingly, in the light emitting device G, the housing 2B and the housing support 130 can be detached from the optical fiber support 120 and replaced with another housing and housing support. As a result, a light color of the output light is obtained according to the application and preference. It is also possible to reuse the laser light source 1, the optical fiber 110, and the optical fiber support 120.

In the light emitting device G according to the present embodiment, the connecting portion preferably has a connecting structure to connect a connecting member on a laser light source 1 side and a connecting member on a housing 2B side by rotating at least one of the connecting member on the laser light source 1 side or the connecting member on the housing 2B side. Specifically, in the light emitting device G, the connecting member on the laser light source 1 side is the optical fiber support 120, and the connecting member on the housing 2B side is the housing support 130. As described above, the housing support 130 includes the engaging protrusion 131, and the optical fiber support 120 includes the engaged recess 122 that engages with the engaging protrusion 131. The inner surface of the engaged recess 122 of the optical fiber support 120 and the outer periphery of the engaging protrusion 131 of the housing support 130 are threaded to correspond each other. Accordingly, the engaged recess 122 of the optical fiber support 120 has a socket shape, and the engaging protrusion 131 of the housing support 130 has a cap shape.

In such a configuration, by rotating at least one of the optical fiber support 120 or the housing support 130, the engaged recess 122 of the optical fiber support 120 and the engaging protrusion 131 of the housing support 130 are engaged with each other. It thus becomes possible to connect and fix the housing support 130 to the optical fiber support 120 by frictional force.

As described above, the connecting portion in the light guiding mechanism is preferably a connecting structure that connects the connecting member on the laser light source 1 side and the connecting member on the housing 2B side, by rotating at least one of them, such as a screw structure or a hook structure. With such a structure, the housing 2B is smoothly attached and detached. Moreover, the connecting portion in the light guiding mechanism may be a fitting structure, and a commercially available optical connector can also be used in this case. Such a fitting structure also prevents the housing 2B from dropping.

As described above, in the light emitting device G, the light guiding mechanism preferably includes the optical fiber support 120 supporting the light emitting part 111 of the optical fiber 110 that guides and emits the laser light 100 emitted from the laser light source 1. The light guiding mechanism preferably further includes the housing support 130 that supports the housing 2B and guides the laser light 100 to the bottom wall 3A of the housing 2B. The screw structure connecting the optical fiber support 120 and the housing support 130 is preferably provided between the optical fiber support 120 and the housing support 130, By providing such a screw structure, a distance between the light emitting part 111 of the optical fiber 110 that emits the laser light 100 and the bottom wall 3A irradiated with the laser light 100 is finely adjusted. By changing the focus of the laser light 100 irradiating the bottom wall 3A, the light distribution characteristics, color tone, or the like of the output light from the housing 2B are easily adjusted.

Figure 9:
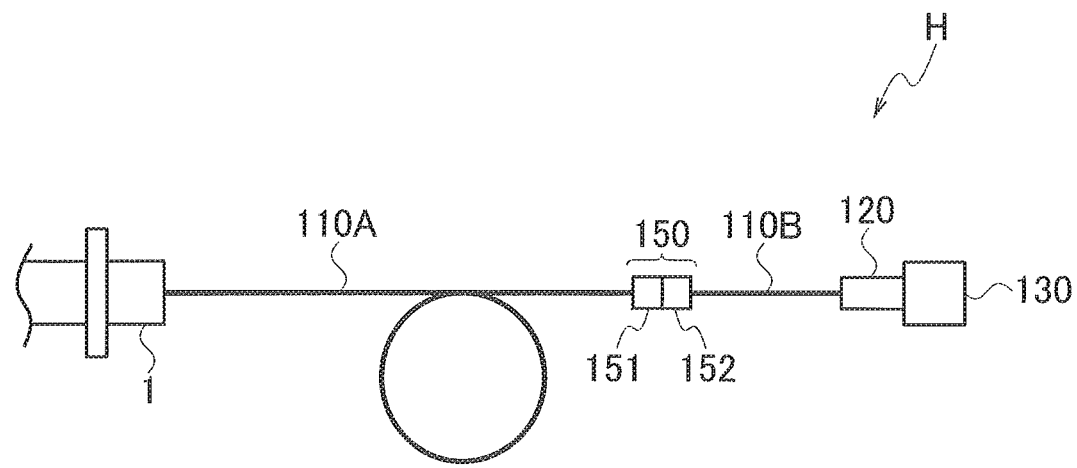
FIG. 9 is a schematic diagram illustrating another example of the light emitting device according to the fourth embodiment.

In the light guiding mechanism of the light emitting device G, the connecting portion is made by the optical fiber support 120 and the housing support 130. However, the present embodiment is not limited to such a structure, and for example, the connecting portion may be provided in the optical fiber 110. Specifically, as shown in FIG. 9, the optical fiber 110 may be configured to be split into two via a connecting portion 150. In a light emitting device H in FIG. 9, connected to the laser light source 1 is one end of a first optical fiber 110A, and connected to the optical fiber support 120 is one end of a second optical fiber 110B. Connected to the other end of the first optical fiber 110A is a first connector 151, and connected to the other end of the second optical fiber 110B is a second connector 152. The first connector 151 and the second connector 152 are connected by, for example, aligning ferrules using a sleeve.

In the light emitting device H having such a configuration, the laser light 100 emitted from the laser light source 1 enters the core of the first optical fiber 110A to be guided through the first optical fiber 110A. Then, the laser light 100 is emitted from the first connector 151 of the connecting portion 150 toward the second connector 152. The laser light 100 emitted to the second connector 152 enters the core of the second optical fiber 110B to be guided through the second optical fiber 110B. Then, the laser light 100 emitted from the light emitting part 111 of the second optical fiber 110B irradiates the bottom wall 3A of the housing 2B.

As described above, in the light emitting device H, by separating the connecting portion 150, the optical fiber support 120, the housing support 130, and the second optical fiber 110B can be removed and replaced with another ones. As a result, the light color of the output light according to the application and preference is obtained, and the laser light source 1 and the first optical fiber 110A are reused. The light emitting device H need not have a structure in which the optical fiber support 120 and the housing support 130 are detachable, and the optical fiber support 120 and the housing support 130 may be formed in one body.

The light emitting device G shown in FIG. 8 and the light emitting device H shown in FIG. 9 are described using the housing 2B according to the second embodiment as the housing, but these light emitting devices are not limited to have the housing 2B. Other transmission type housings may be used.

EXAMPLES

The present embodiments are described in more detail using an example below. However, the present embodiments are not limited to the example.

Example (Manufacturing of Wavelength Conversion Member)

A film of silver having a thickness of 130 nm was formed on a small piece of silicon having a length of 20 mm, a width of 20 mm, and a thickness of 0, 8 mm by a sputtering method. A substrate A provided with a light reflecting film on the surface of the silicon small piece was thus obtained.

Next, yttrium aluminum garnet (YAG) particles, perhydropolysilazane, and magnesium fluoride particles were weighed in a mass ratio of 5:1:0.05 and then kneaded. Yttrium aluminum garnet (YAG) particles used were manufactured by NEMOTO LUMI-MATERIALS CO., LID. and have an average particle diameter of 20 μm. Perhydropolysilazane used was manufactured by Merck Performance Materials Ltd., having a product number NA-120NL. Magnesium fluoride particles used have an average particle diameter of 40 nm. The obtained kneaded material was applied on the substrate A using a bar coater.

The substrate A coated with the kneaded material was dried on a hot plate at 150° C. and then baked in an electric furnace at 400° C. This provides a wavelength conversion member in which the wavelength converter containing YAG particles and the substrate A were formed in one body.

As a result of visual observation of the wavelength conversion member, the wavelength converter on the substrate A was a yellow film. Moreover, as a result of measuring a level difference between the surface of the substrate A and the surface of the wavelength converter using a stylus profilometer (Bruker Corporation, stylus profiling system Dektak), the wavelength converter was a film having a thickness of 100 μm.

(Manufacturing of Light Diffusing Member)

Alumina particles, perhydropolysilazane, and magnesium fluoride particles were weighed in a mass ratio of 5:1:0.05 and then kneaded. Alumina particles used have an average particle diameter of 20 μm. Perhydropolysilazane used was manufactured by Merck Performance Materials Ltd., having a product number NA-120NL. Magnesium fluoride particles used have an average particle diameter of 40 nm. The obtained kneaded material was applied on the substrate A made in Example using a bar coater.

The substrate A applied with the kneaded material was dried on a hot plate at 150° C. and then baked in an electric furnace at 250° C. This provides a light diffusing member in which the light diffusing layer containing alumina particles and the substrate A were formed in one body.

As a result of visual observation of the light diffusing member, the light diffusing layer on the substrate A was a white film. Moreover, as a result of measuring a level difference between the surface of the substrate A and the surface of the light diffusing layer using a stylus profilometer (Bruker Corporation, stylus profiling system Dektak), the light diffusing layer was a film having a thickness of 150 μm.

(Manufacturing of Housing)

Figure 10:
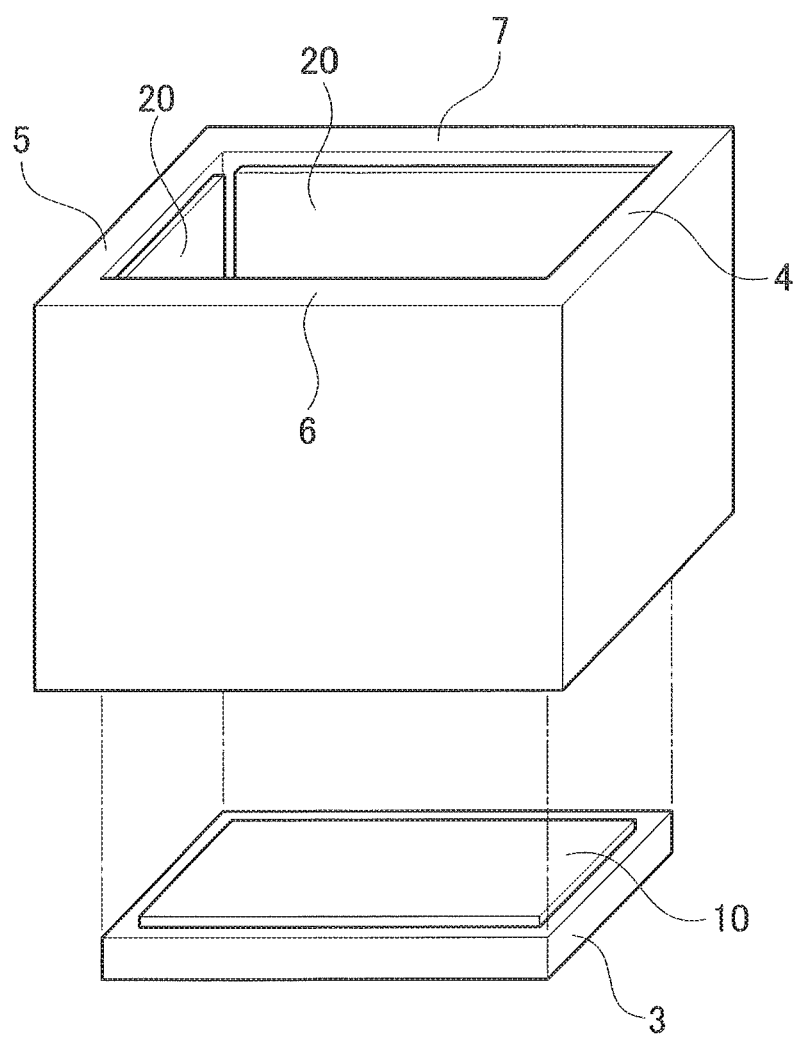
FIG. 10 is a schematic perspective view for illustrating assembly process of a light emitting device according to an example.

As shown in FIG. 10, by surrounding the periphery of one light diffusing member with four wavelength conversion members, a substantially rectangular housing was obtained as a test sample of the present example.

Comparative Example

The wavelength conversion member made in the example was used as a test sample of the present comparative example.

Evaluation

Figure 11:
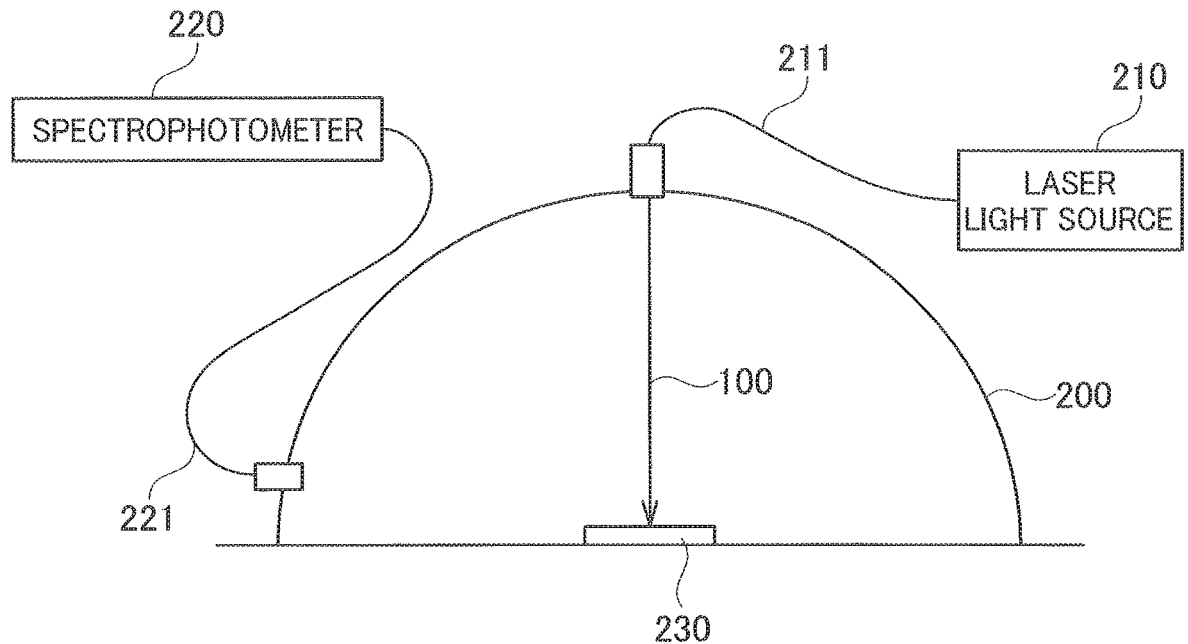
FIG. 11 is a cross-sectional view for illustrating an evaluation method of light emitting devices according to the example and a comparative example.

The intensity of the output light emitted from the test samples of the example and the comparative example was measured using an evaluation apparatus shown in FIG. 11.

As shown in FIG. 11, a laser light source 210 was connected to a hemispherical integrating sphere 200 using a light guide fiber 211. A blue laser light source having a wavelength of 444 nm was used as the laser light source 210. A fiber coupled high brightness blue direct diode laser BLUE IMPACT (registered trademark) manufactured by SHIMADZU CORPORATION was used as the blue laser light source. With respect to the integrating sphere 200, the light source 210 is installed so that the laser light 100 is emitted toward the inside of the integrating sphere 200. At this time, the laser light 100 was adjusted to be incident on a test sample 230 from the perpendicular direction.

Furthermore, a spectrophotometer 220 was connected to the side surface of the integrating sphere 200 using a light guide fiber 221. The spectrophotometer used was a multichannel spectroscope MCPD-9800 manufactured by Otsuka Electronics Co., Ltd.

Next, as shown in FIG. 11, the laser light 100 was incident on the test sample 230 from the perpendicular direction. That is, in the test sample of the example, the laser light 100 was emitted from the perpendicular direction to the light diffusing member. In the test sample of the comparative example, the laser light 100 was emitted from the perpendicular direction to the wavelength conversion member.

Then, a part of the mixed light of the diffused light of the laser light 100 diffusing inside the integrating sphere 200 and the fluorescence emitted from the test sample was taken out, and the power (radiant flux) and chromaticity of the Output light were measured by a spectrophotometer. The spot diameter of the laser light 100 applied to the test sample was about 1 mm in diameter, and the power density was adjusted between 3.8 W/mm$^2$ and 100 W/mm$^2$. Thus, the power and color temperature of the output light emitted from the test sample were measured.

Figure 12:
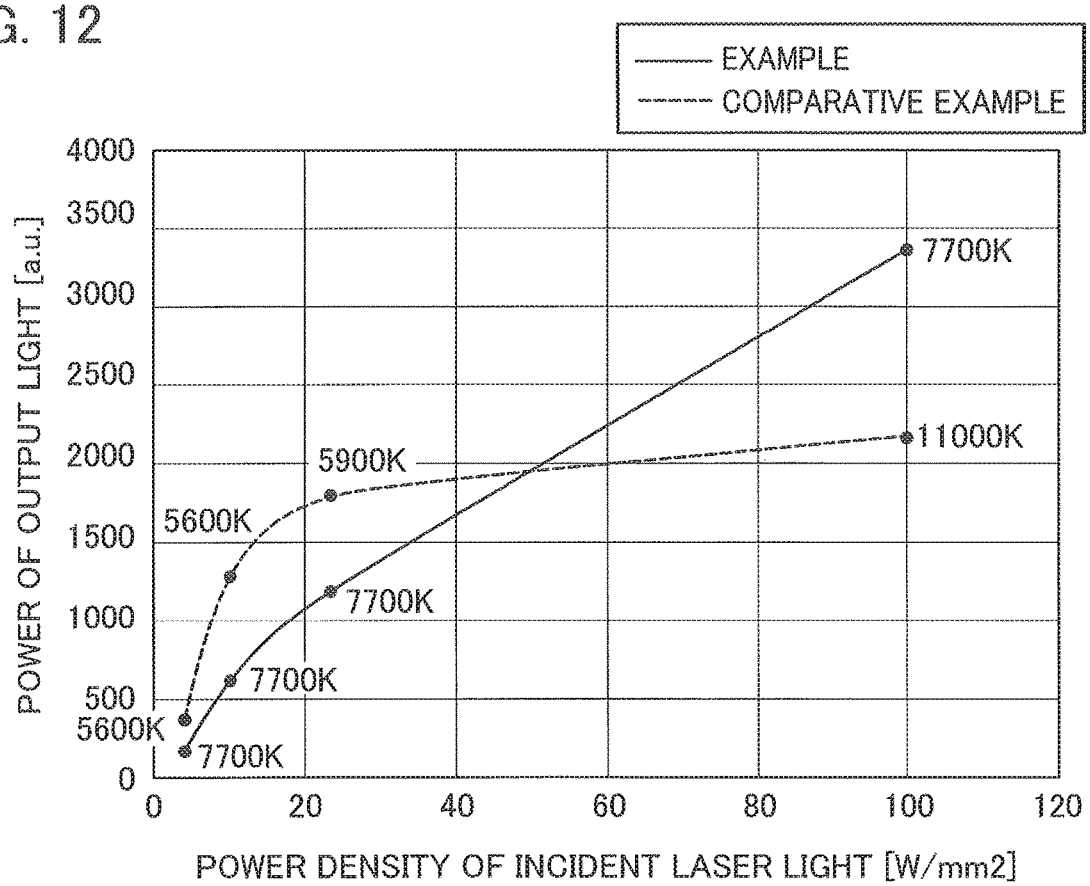
FIG. 12 is a graph illustrating a relationship between power density of incident laser light and power of output light in light emitting devices according to the example and the comparative example.

FIG. 12 shows the relationship between the power density of the incident laser light and the power of the output light emitted from the test samples of the example and the comparative example. FIG. 12 also shows the color temperature at each measurement point.

As shown in FIG. 12, the test sample of the comparative example has a saturated output as the power density of the incident laser light 100 increases. This indicates that the increase in the power density of the laser light 100 causes the output saturation of the wavelength converter. In contrast, it is shown that the test sample of the example does not have the output saturation behavior observed in the comparative example, and the output improves relatively linearly.

Also, it is shown that in the test sample of the comparative example, the color temperature increases as the power density of the laser light 100 increases, and the yellow component is hardly emitted. In contrast, in the test sample of the example, it is shown that the color temperature hardly changes even when the power density of the laser light 100 increases.

Although the contents of this embodiment have been described above in accordance with the Example, it is obvious to those skilled in the art that this embodiment is not limited to the description of these and that various modifications and improvements are possible.

The entire contents of Japanese Patent Application No. 2018-080467 (application date: Apr. 19, 2018) and Japanese Patent Application No. 2018-209007 (application date: Nov. 6, 2018) are incorporated herein by reference.

INDUSTRIAL APPLICABILITY

According to the present disclosure, a light emitting device improving the color uniformity and the chromaticity flexibility while increasing the power density of output light is obtained.

REFERENCE SIGNS LIST

1 LASER LIGHT SOURCE
2A, 2B, 2C, 2D, 2E, 2F HOUSING
3, 3A BOTTOM WALL
4A SIDE WALL
8 APERTURE
10 LIGHT DIFFUSING LAYER
20 FIRST WAVELENGTH CONVERTER
100 LASER LIGHT
110 OPTICAL FIBER
111 LIGHT EMITTING PART
120 OPTICAL FIBER SUPPORT
130 HOUSING SUPPORT
150 CONNECTING PORTION
A, B, C, D, E, F, G, H LIGHT EMITTING DEVICE

The invention claimed is:

1. A light emitting device, comprising:
a laser light source that emits laser light;
a housing that includes a bottom wall and a side wall; and
a first wavelength converter provided on the side wall, the first wavelength converter containing a first phosphor,
wherein the bottom wall of the housing is irradiated with the laser light emitted from the laser light source,
the first phosphor is excited by diffused light of the laser light diffused by the bottom wall, and
the bottom wall of the housing is directly irradiated with the laser light while the first wavelength converter is not directly irradiated with any laser light.

2. The light emitting device according to claim 1, wherein the bottom wall comprises a light diffusing layer that diffuses the laser light.

3. The light emitting device according to claim 2, wherein the light diffusing layer is a light diffusing body containing non-luminous inorganic particles and no phosphor; and
the first wavelength converter is excited by diffused light diffused by irradiating the light diffusing layer with the laser light.

4. The light emitting device according to claim 2, wherein the light diffusing layer is a second wavelength converter containing a second phosphor, and the first wavelength converter is excited by diffused light diffused by irradiating the light diffusing layer with the laser light.

5. The light emitting device according to claim 2, wherein the light diffusing layer is made of only an inorganic substance.

6. The light emitting device according to claim 1, wherein the bottom wall of the housing is made of a reflecting member that reflects the laser light, and
the laser light enters an internal space of the housing through an aperture of the housing.

7. The light emitting device according to claim 1, wherein the bottom wall of the housing is made of a translucent member that transmits the laser light, and
the laser light enters an internal space of the housing through the bottom wall.

8. The light emitting device according to claim 2, wherein when viewed along an optical axis of the laser light emitted from the laser light source toward the bottom wall, the area of an aperture communicating with an internal space of the housing is smaller than that of the light diffusing layer.

9. The light emitting device according to claim 2, wherein when viewed along an optical axis of the laser light emitted from the laser light source toward the bottom wall, the area of an aperture communicating with an internal space of the housing is larger than that of the light diffusing layer.

10. The light emitting device according to claim 7, further comprising:
a light guiding mechanism interposed between the laser light source and the housing, the light guiding mechanism guiding the laser light emitted from the laser light source to the bottom wall,
wherein the light guiding mechanism comprises a connecting portion that is detachable.

11. The light emitting device according to claim 10, wherein the connecting portion comprises a connecting structure that connects a connecting member on a laser light source side and a connecting member on a housing side by rotating at least one of the connecting member on the laser light source side or the connecting member on the housing side.

12. The light emitting device according to claim 10, wherein the light guiding mechanism comprises an optical fiber support that supports a light emitting part of an optical fiber that guides and emits the laser light emitted from the laser light source, and a housing support that supports the housing and guides the laser light to the bottom wall of the housing, and
the optical fiber support and the housing support have a screw structure therebetween, the screw structure connecting the optical fiber support and the housing support.

13. The light emitting device according to claim 2, wherein the first wavelength converter is not arranged on an optical axis of the laser light with which the light diffusing layer is directly irradiated.

14. The light emitting device according to claim 1, wherein the device has only a single light source that directs the laser light only at the bottom wall.

* * * * *